United States Patent
Siegmund et al.

(10) Patent No.: US 10,468,326 B2
(45) Date of Patent: Nov. 5, 2019

(54) METAMATERIAL SYSTEMS AND METHODS FOR THEIR USE

(71) Applicant: Purdue Research Foundation, West Lafayette, IN (US)

(72) Inventors: Thomas Siegmund, West Lafayette, IN (US); Yuezhong Feng, Henan (CN); Somesh Khandelwal, Sunnyvale, CA (US)

(73) Assignee: Purdue Research Foundation, West Lafayette, IN (US)

( * ) Notice: Subject to any disclaimer, the term of this patent is extended or adjusted under 35 U.S.C. 154(b) by 990 days.

(21) Appl. No.: 14/299,075

(22) Filed: Jun. 9, 2014

(65) Prior Publication Data

US 2014/0360709 A1 Dec. 11, 2014

Related U.S. Application Data

(60) Provisional application No. 61/833,141, filed on Jun. 10, 2013.

(51) Int. Cl.
*H01L 23/373* (2006.01)
*F28F 13/00* (2006.01)
*H01L 23/367* (2006.01)

(52) U.S. Cl.
CPC .... *H01L 23/3735* (2013.01); *F28F 2013/001* (2013.01); *F28F 2013/008* (2013.01);
(Continued)

(58) Field of Classification Search
CPC ......... H01L 23/3735; H01L 2924/0002; H01L 23/3737; H01L 23/3736; H01L 23/367; F28F 2013/008; F28F 2013/001
See application file for complete search history.

(56) References Cited

U.S. PATENT DOCUMENTS

| | | | |
|---|---|---|---|
| 7,405,698 B2 * | 7/2008 | de Rochemont | H01Q 1/362 343/700 MS |
| 8,831,058 B2 * | 9/2014 | Morel | H01S 5/18377 372/34 |

(Continued)

FOREIGN PATENT DOCUMENTS

EP        3252415 B1 * 3/2019      F28F 9/22

OTHER PUBLICATIONS

Dyskin A.V., Estrin Y., Kanel-Belov A.J., Pasternak E., A new concept in design of materials and structures: assemblies of interlocked tetrahedron-shaped elements, Scripta Materialia 44, 12, pp. 2689-2694, 2001.

(Continued)

*Primary Examiner* — Ljiljana V. Ciric
(74) *Attorney, Agent, or Firm* — Hartman Global IP Law; Gary M. Hartman; Domenica N. S. Hartman

(57) ABSTRACT

Metamaterial systems capable of exhibiting changes in thermal conductivities in response to an external control or input, as well as methods relating thereto. The metamaterial systems include first and second plates, and a metamaterial core between and thermally coupled to the first and second plates. The metamaterial core comprises a plurality of elements coupled to and contacting each other, with each of the elements being a pseudo-tetrahedron having surfaces that define surface-to-surface contacts with at least one other of the elements. A force is applied to the metamaterial core that increases contact pressures between the elements at the surface-to-surface contacts thereof and thereby increases thermal contact conductivities at the surface-to-surface contacts and increases a thermal conductivity of the metamaterial core.

20 Claims, 19 Drawing Sheets
(1 of 19 Drawing Sheet(s) Filed in Color)

(52) U.S. Cl.
CPC ........ *H01L 23/367* (2013.01); *H01L 23/3736* (2013.01); *H01L 23/3737* (2013.01); *H01L 2924/0002* (2013.01)

(56) References Cited

U.S. PATENT DOCUMENTS

| | | | | |
|---|---|---|---|---|
| 9,014,225 | B2* | 4/2015 | Padullaparthi | H01S 3/042 372/34 |
| 10,211,169 | B2* | 2/2019 | Yoon | H01L 23/15 |
| 10,283,689 | B2* | 5/2019 | Hussein | H01L 35/04 |
| 2004/0264530 | A1* | 12/2004 | Ryou | H01S 5/18308 372/44.01 |
| 2008/0180786 | A1* | 7/2008 | Bratkovski | G02F 1/37 359/328 |
| 2008/0206589 | A1* | 8/2008 | Aitken | H01L 51/5253 428/639 |
| 2010/0133200 | A1* | 6/2010 | Gin | G01N 21/05 210/742 |
| 2012/0019432 | A1* | 1/2012 | Bowers | G02B 1/005 343/909 |
| 2012/0217653 | A1* | 8/2012 | Takemura | H01L 23/3128 257/774 |
| 2012/0288627 | A1* | 11/2012 | Hodges, Jr. | H01Q 1/38 427/265 |
| 2013/0243693 | A1* | 9/2013 | Omenetto | A61Q 17/04 424/9.1 |
| 2014/0102686 | A1* | 4/2014 | Yu | F28F 9/00 165/185 |
| 2015/0338175 | A1* | 11/2015 | Raman | F28F 13/18 165/185 |
| 2016/0043253 | A1* | 2/2016 | Smith | H01L 31/0392 438/57 |
| 2016/0363394 | A1* | 12/2016 | Liu | F28F 9/22 |
| 2017/0108756 | A1* | 4/2017 | Huang | H01L 31/00 |
| 2017/0125656 | A1* | 5/2017 | Hussein | H01L 35/04 |
| 2017/0187124 | A1* | 6/2017 | Kirino | H01Q 13/20 |
| 2019/0017758 | A1* | 1/2019 | Raman | F28F 13/18 |
| 2019/0139914 | A1* | 5/2019 | Kirino | H01P 3/085 |

OTHER PUBLICATIONS

Estrin, Y., Dyskin, A.V., Pasternak, E., Topological interlocking as a material design concept, Material Science and Engineering: C, 31, 6, pp. 189-1194, 2011.

Lambert, M.A., and Fletcher, L.S., 1993, Review of the thermal contact conductance of junctions with metallic coatings and films, Journal of Thermophysics and Heat Transfer, 7, No. 4, pp. 547-554.

Madhusudana C.B., 1996, Thermal Contact Conductance, Springer-Verlag, New York.

* cited by examiner

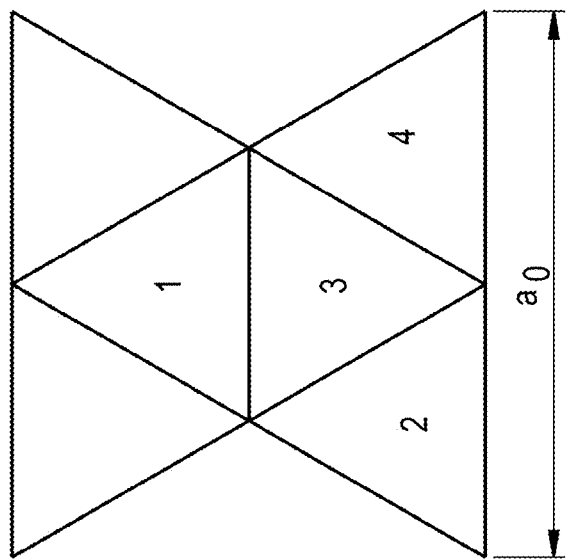
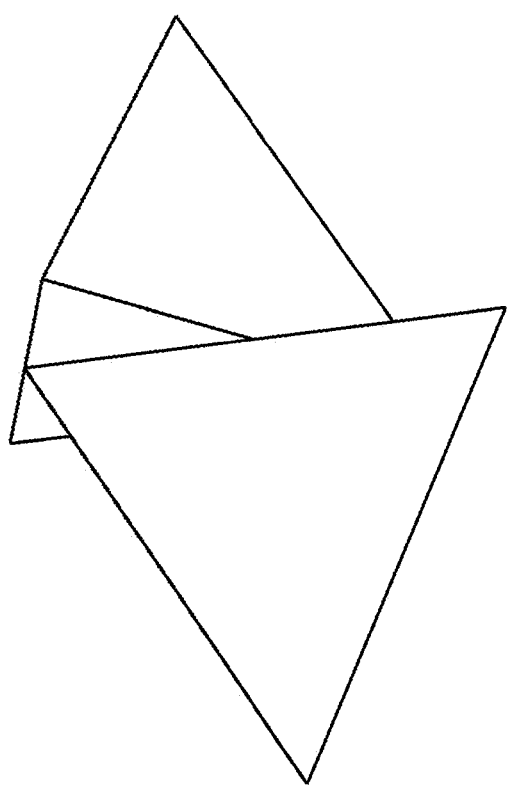
FIG. 11

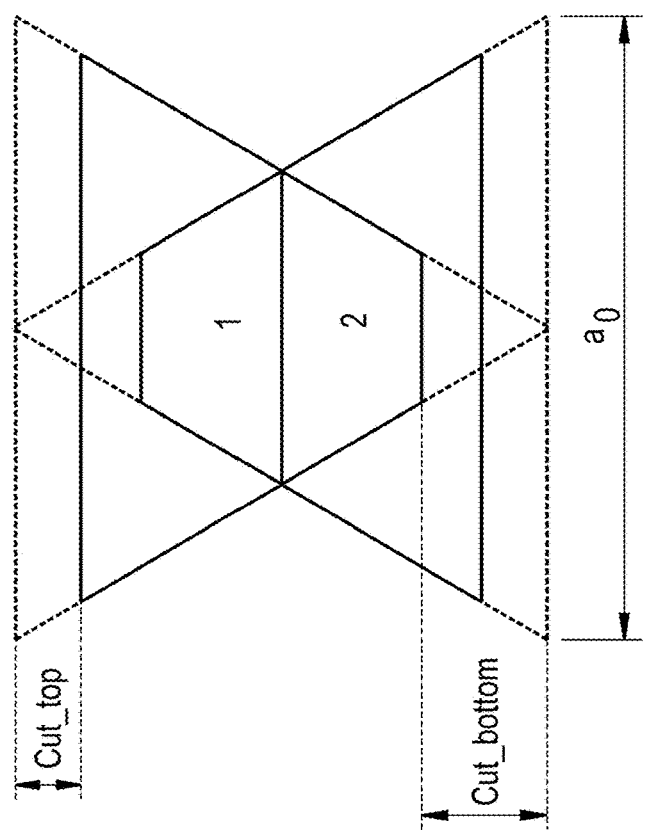
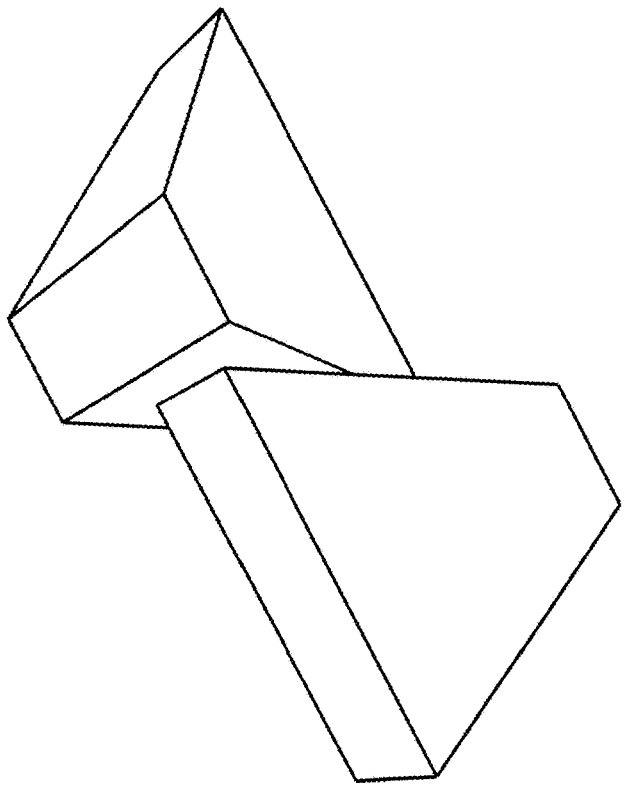
FIG. 13

METAMATERIAL SYSTEMS AND METHODS FOR THEIR USE

CROSS REFERENCE TO RELATED APPLICATIONS

This application claims the benefit of U.S. Provisional Application No. 61/833,141, filed Jun. 10, 2013, the contents of which are incorporated herein by reference.

BACKGROUND OF THE INVENTION

The present invention generally relates to materials and their thermal conductivities. More particularly, this invention relates to material systems capable of exhibiting changes in their thermal conductivities in response to an external control or input, and wherein such external controls/inputs may be in addition to or independent of temperature.

Thermal conductivity is an important property in heat transfer. In particular, thermal conductivity is a measure of how heat transfers through a material, and is generally intrinsically dependent on the particular material. Referring to FIG. 1, heat flux through a slab of material is determined based on equation (1):

$$q = -kA(T_1-T_2)/s \quad \text{Eq. (1)}$$

where q is the heat flux (the rate of heat transfer) between and transverse to two parallel surfaces of the material that are separated by a distance s, A is the cross-sectional area through which heat is transferred through the slab, k is the thermal conductivity of the material, and $T_1-T_2$ is the temperature difference between the two surfaces of the slab, where $T_1$ represents the hotter surface and $T_2$ represents the colder surface of the slab (i.e., $T_1 > T_2$).

Equation (2) addresses the situation represented in FIG. 2 in which a slab is composed of multiple layers (in this case, three layers) that are attached to each other.

$$q = -(T_1-T_2)/[s_1/(k_1 \cdot A_1) + s_2/(k_2 \cdot A_2) + s_3/(k_3 \cdot A_3)] \quad \text{Eq. (2)}$$

where q is the heat flux between and transverse to two parallel surfaces of the multilayer slab at temperatures $T_1$ and $T_2$, $k_1$, $k_2$, and $k_3$ are the thermal conductivities of the respective three individual layers of the slab, $A_1$, $A_2$, and $A_3$ are the cross-sectional areas of the respective three individual layers through which heat is transferred, and $s_1$, $s_2$, and $s_3$ are the thicknesses of the respective three individual layers. In systems where imperfect thermal contact between individual layers of a multilayer slab is to be considered, the heat flux through the slab takes into consideration the thermal resistance attributable to contact at the interfaces between layers, and the heat flux across each interface is determined based on Equation (3):

$$q_c = -(T_{c1}-T_{c2})/[1/(h_c \cdot A_c)] \quad \text{Eq. (3)}$$

where $q_c$ is the heat flux across an interface, $h_c$ is the thermal contact conductance across the interface, $A_c$ is the contact area of the interface, and $T_{c1}-T_{c2}$ is the temperature difference across the interface. The thermal contact conductance is dependent on various factors, including surface quality of the contacting surfaces and any applied contact pressure.

Thermal stresses arise when if thermal expansion of materials or structures is restricted. The thermal stress of a unidirectionally confined slab of material is based on Equation (4), $$\sigma = -E\alpha(T-T_0) \quad \text{Eq. (4)}$$

where σ is the thermal stress, E the elastic modulus of the materials, α is the coefficient of thermal expansion, and $T-T_0$ is the difference between the stress free temperature $T_0$ and the current temperature T.

Current theories describe thermal conductivity in solids as the migration of free electrons and lattice vibrations. These two processes are additive, but the transport due to electrons is more efficient than the transport through vibrational energy in the lattice structure of the solid. With an increase in temperature, electron motion is increasingly difficult due to the vibration of the lattice and thus the thermal conductivity is found to decline with increasing temperature, particularly for solids that are good thermal conductors such as copper, silver, and aluminum. Thus, with increasing temperatures, thermal conductivity decreases and causes the heat flux through a slab to decrease for the same temperature gradient (i.e., when one side is connected to a heat sink). For the same heat flux, the temperature gradient will be higher across the slab.

In view of the above, it can be appreciated that there are situations in which it would be desirable if the negative impact of increasing temperature on thermal conductivity could be diminished, and/or thermal conductivity could be tunable to obtain a desired response within a material system or structure, for example, the thermal conductivity of a material system or structure could be intentionally varied in a manner other than that which would be ordinarily attributable solely to temperature.

BRIEF DESCRIPTION OF THE INVENTION

The present invention provides metamaterial systems capable of exhibiting changes in thermal conductivities in response to an external control or input, as well as methods relating thereto, wherein such external controls/inputs may be in addition to or independent of temperature.

According to one aspect of the invention, a metamaterial system includes first and second plates, and a metamaterial core between and thermally coupled to the first and second plates. The metamaterial core comprises a plurality of elements coupled to and contacting each other, with each of the elements being a pseudo-tetrahedron having surfaces that define surface-to-surface contacts with at least one other of the elements. Means is provided for contacting and exerting force on the metamaterial core that increases contact pressures between the elements at the surface-to-surface contacts thereof and thereby increases thermal contact conductivities at the surface-to-surface contacts and increases thermal conductivity of the metamaterial core.

According to another aspect of the invention, a metamaterial system includes first and second spreader plates and a metamaterial core between and mechanically coupled to the first and second plates. The metamaterial core comprises a plurality of elements, each being coupled to and contacting at least one other of the elements. Each element is a pseudo-tetrahedron having surfaces that define surface-to-surface contacts with the at least one other of the elements, and each of the pseudo-tetrahedra comprises two parallel rectangular surfaces and four trapezoidal surfaces. A frame is disposed around the metamaterial core, contacts at least some of the elements thereof, and exerts confinement on the metamaterial core that increases contact pressures between the elements at the surface-to-surface contacts thereof and thereby increases thermal contact conductivities at the surface-to-surface contacts and increases thermal conductivity of the metamaterial core. The elements are arranged to transfer the force throughout the metamaterial core, and the frame being configured to change in size in response to an external stimulus (for example, temperature and/or other input(s)) and thereby change the force exerted on the elements.

Other aspects of the invention include methods of using a metamaterial system comprising the elements described above.

Technical effects of metamaterial systems described above preferably include the ability of their metamaterial cores to provide a tunable thermal conductivity as a function of one or more external stimuli, which can be in conjunction with or independent of temperature. As nonlimiting examples, structures of the metamaterial cores may be manipulated so that as their temperatures increase, their thermal conductivities are tunable, for example, decreasing to a lesser extent than would result from increasing temperature, remain roughly constant with increasing temperature, or in some cases increase with increasing temperature.

Other aspects and advantages of this invention will be better appreciated from the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 11 represents perspective and schematic views of a tetrahedral structural unit assembly comprising two elements of the type represented in FIGS. 10a and 10b.

FIG. 13 represents perspective and schematic views of a pseudo-tetrahedra structural unit assembly comprising two pseudo-tetrahedra elements generated by truncating a tetrahedron in a manner represented in FIGS. 12c through 12f.

DETAILED DESCRIPTION OF THE INVENTION

Figure 1:
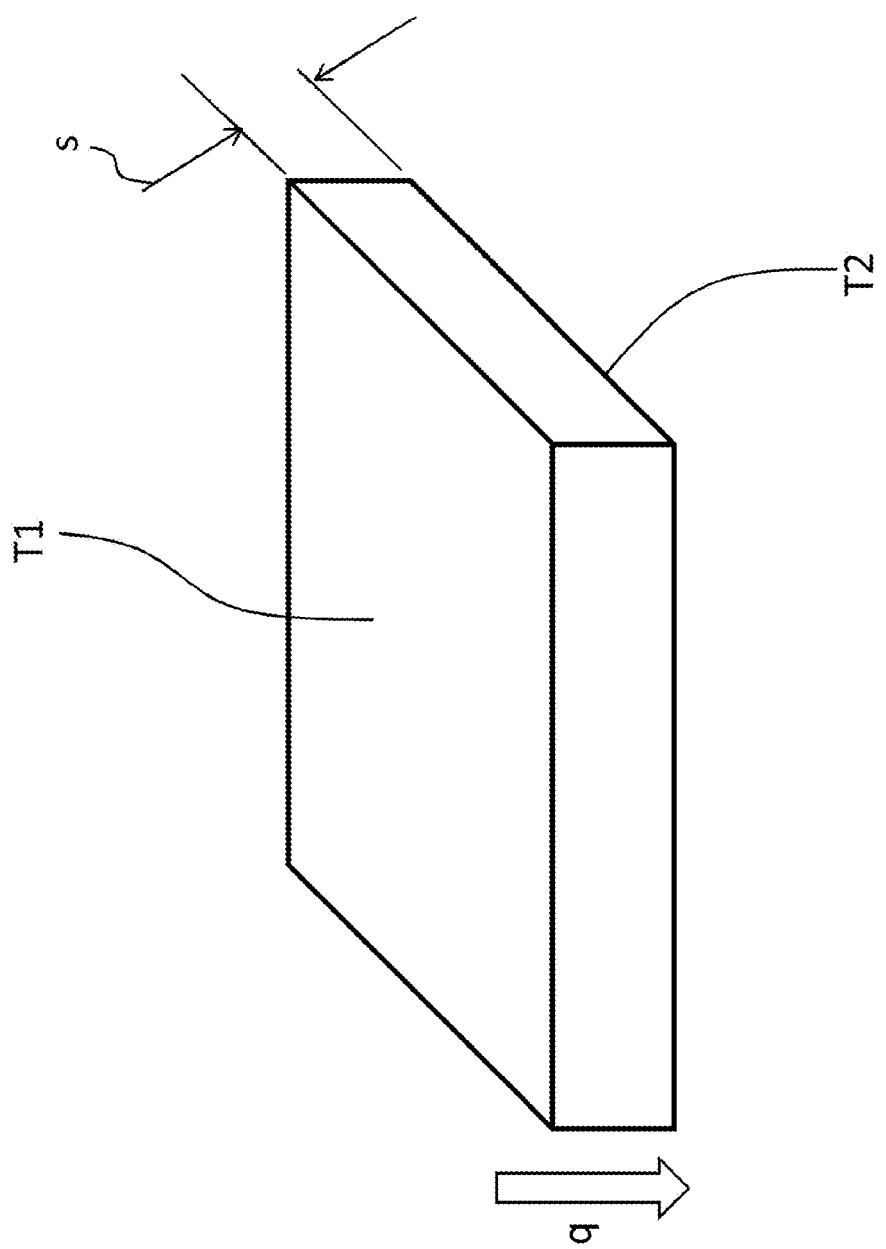
FIG. 1 schematically represents a perspective view of a slab of material and identifies certain parameters relating to heat transfer therethrough.
Figure 2:
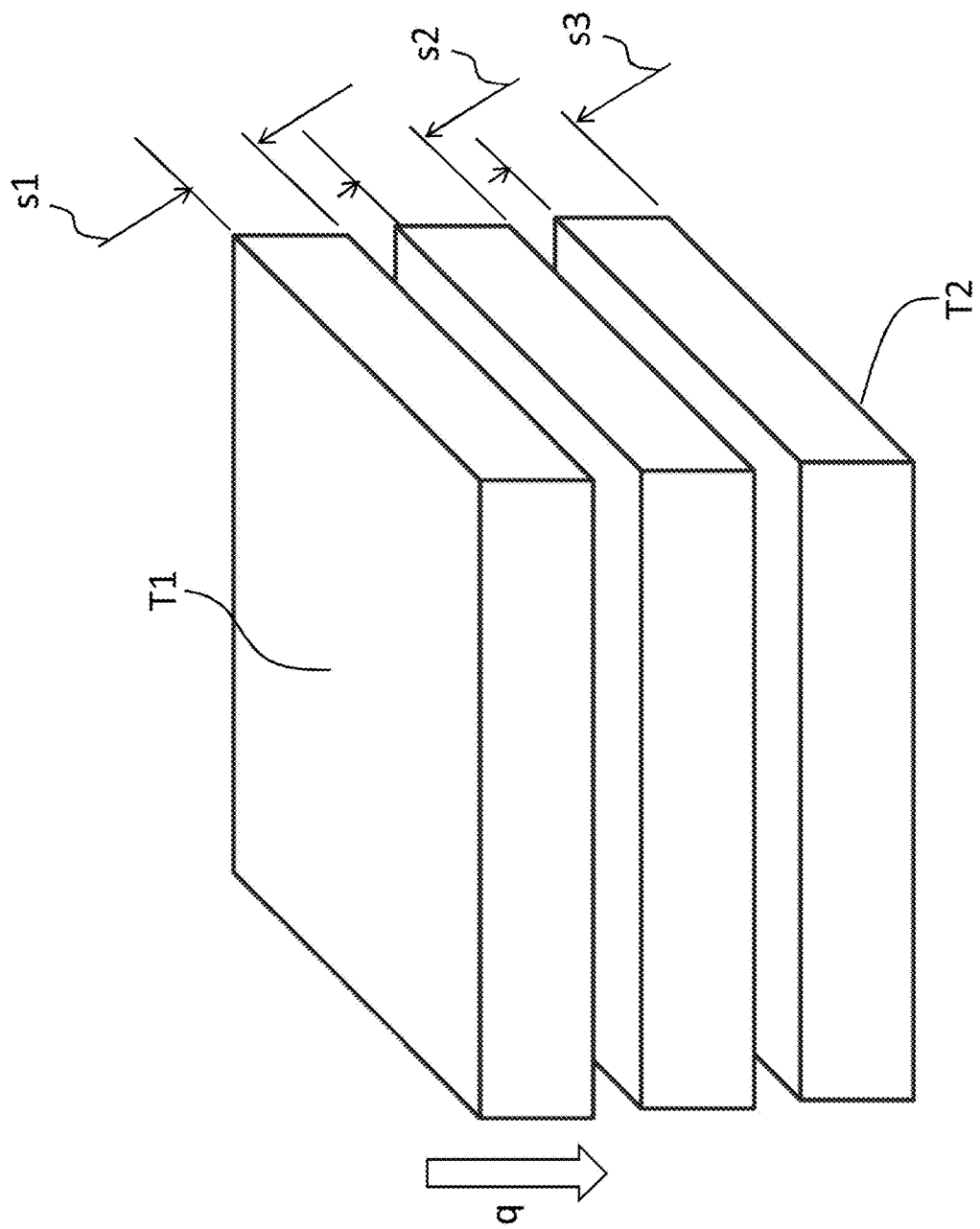
FIG. 2 schematically represents a perspective view of a multilayer slab of material and identifies certain parameters relating to heat transfer therethrough.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

The embodiments discussed below will be described in reference to metamaterials with variable thermal conductivities. As the term is used herein, metamaterials will refer to structures that are engineered to comprise assemblies of multiple individual elements arranged in repeating patterns, and whose properties are largely derived from the shape, geometry, size, orientation, and/or arrangement of their elements.

Figure 3:
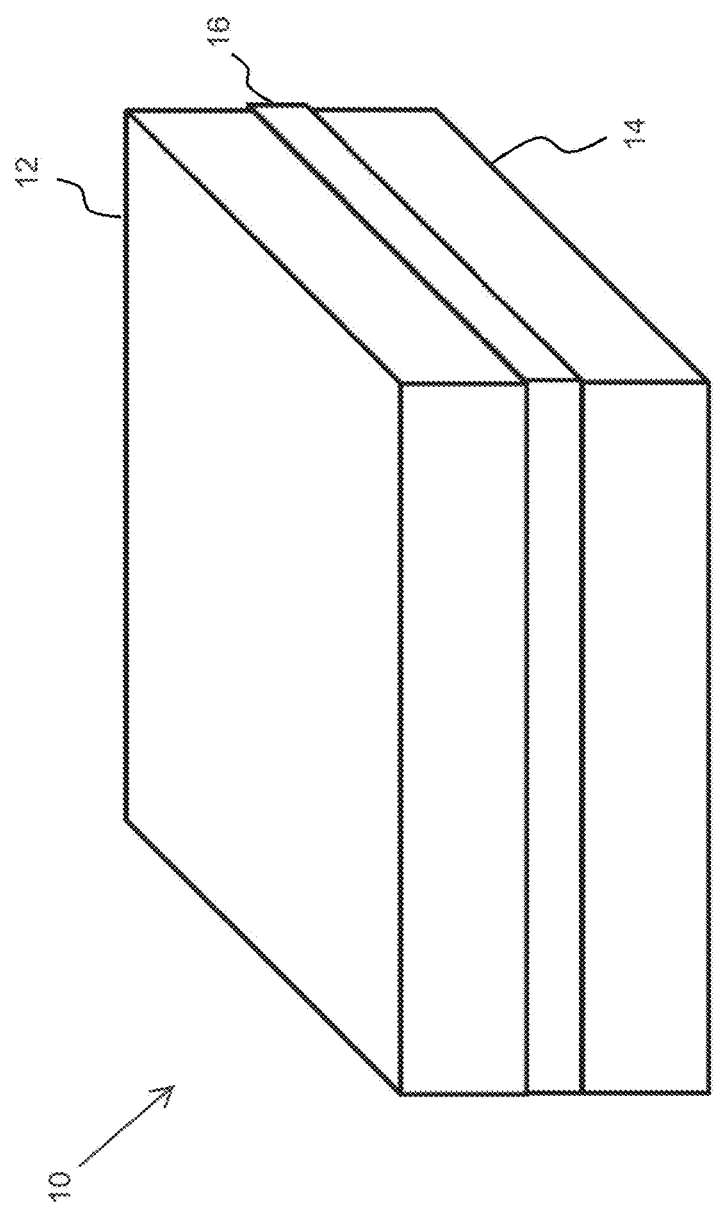
FIG. 3 schematically represents a perspective view of a multilayer slab of material in which a metamaterial core has been incorporated in accordance with a nonlimiting embodiment of this invention.
Figure 4:
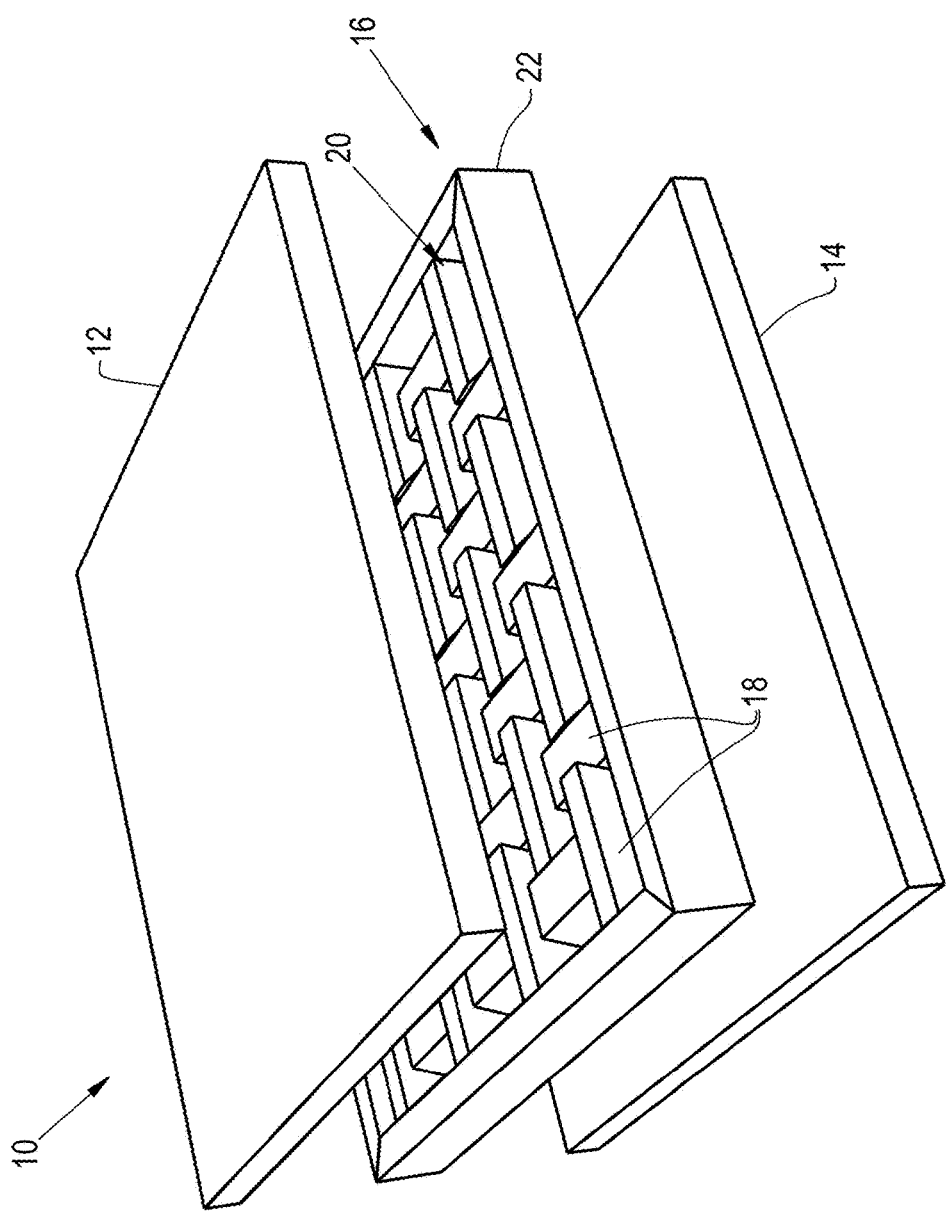
FIG. 4 schematically represents an exploded view of the multilayer slab of FIG. 3.

Referring to FIG. 3, an exemplary metamaterial system 10 is depicted that can be used in thermal applications. The system 10 includes a pair of plates 12 and 14 and a metamaterial core 16 therebetween. The plates 12 and 14 will be referred to as upper and lower (or top and bottom) spreader plates 12 and 14 to indicate their functions as promoting a relatively uniform distribution of thermal energy over the cross-sectional area of the metamaterial core 16. The core 16 is thermally coupled to the plates 12 and 14, denoting that heat transfer occurs to and from the core 16 through the plates 12 and 14. For this purpose, certain portions of the core 16 can be directly mechanically coupled with the plates 12 and 14. In addition, thermal coupling between the core 16 and plates 12 and 14 can be desirably enhanced, for example, with a thermal grease that does not restrict the motion of the elements 18 relative to each other and to the remainder of the system 10. An exploded perspective view of the system 10 shown in FIG. 3 is depicted in FIG. 4. The metamaterial core 16, which may also be referred to herein as a variable conductivity metamaterial (VCM), is constructed of topologically interlocked units of polyhedral elements 18. The elements 18 can be formed of the same or different materials. Example materials include metallic solids (e.g., copper, silver, or aluminum), polymers (e.g., plastics), or other solid materials suitable for thermal application and known to a person having ordinary skill in the art. The elements 18 interact by contact only, such that conductivity within and through the core 16 is highly dependent on thermal contact conductance between interfacing elements 18 and, as such, contact conditions at interfaces between the elements 18. As such, the thermal conductivity of the core 16 can be controlled by external stimuli that affect the mechanical interaction of the elements 18, for example, external forces that can be mechanically applied thereto that are entirely independent of temperature, as well as external forces that are dependent on temperature changes to which the core 16 is subjected.

As depicted in FIG. 4, the elements 18 of the metamaterial core 16 are represented as pseudo-tetrahedra arranged by two-dimensional packing to define a pseudo-tetrahedra metamaterial structure 20 having a plate-like configuration.

As used herein, a pseudo-tetrahedron denotes a three-dimensional shape resulting from truncating a tetrahedron, and the term pseudo-tetrahedra (or pseudo-tetrahedral) structure denotes a three-dimensional structure comprising more than one pseudo-tetrahedron. Since the elements 18 thermally and mechanically interact by contact only, the through-thickness and in-plane conductivities of the structure 20 are substantially dependent on the contact conditions between interfacing elements 18 and the thermal contact conductance resulting therefrom. Such thermal contact conductance can consequently be controlled by mechanical forces, allowing the control of the thermal conductivity of the structure 20 by a mechanical input or stimulus. For this purpose, the structure 20 is shown in FIG. 4 as being surrounded by a frame 22, which for certain embodiments is also referred to herein as a compression-inducer member 22. The compression-inducer member 22 is configured to apply forces to the metamaterial structure 20 of the core 16, causing the build-up of contact pressure between the elements 18. As nonlimiting examples, an increase in contact pressure between the elements 18 can be caused by applying an external force with or to the compression-inducer member 22 or, for that matter, any means capable of applying a force to the elements 18 that results in increased contact pressures between interfacing elements 18. As a particular example, a thermally-induced force can be generated as a result of the materials of the elements 18 and member 22 having different thermal expansion coefficients, such that the member 22 expands at a different rate than the pseudo-tetrahedra metamaterial structure 20. In any case, an external stimulus (e.g., force, heat, etc.) can be applied to the structure 20 to increase contact pressure between the elements 18 of the metamaterial structure 20. With increasing contact pressure, thermal resistance can be decreased (corresponding to an increase in thermal contact conductance) at the interfaces between elements 18 in contact with each other, providing the design freedom to tune thermal parameters (e.g., thermal conductivity) utilizing various control parameters (e.g., temperature, force, pressure, etc.).

The pseudo-tetrahedra metamaterial structure 20 represented in FIG. 4 includes elements 18 configured as truncated tetrahedra arranged in an alternating and offset pattern. The coefficients of thermal expansion of the spreader plates 12 and 14, the compression-inducer member 22, and the core 16 are selected such that thermal stresses develop in desired ways to control the through-thickness thermal conductivity of the structure 20 (i.e., in a direction normal to the planes of the plates 12 and 14 and core 16) via the development of thermal stresses and the subsequent alterations in contact conductance between elements 18.

In investigations leading to the present invention, computational analyses were conducted to demonstrate characteristics of a metamaterial system such as that represented in FIGS. 3 and 4. The investigations considered conditions of transverse heat flow through a metamaterial core comprising a metamaterial structure surrounded by a rigid frame (compression-inducer member). Elements of the metamaterial structure were considered as conductive solids (such as, but not limited to, copper). For purposes of the study, the frame was considered to be formed of a material of perfectly zero thermal conductivity and zero thermal expansion, approximating Pyrex glass or another material of similar thermal properties.

A pressure-dependent thermal contact conductance behavior was defined which can be configured to increase linearly with pressure. A fully-coupled thermal-mechanical analysis method was employed that included the ability to solve thermal and stress fields simultaneously in a finite element code, apply temperature boundary conditions with prescribed temperatures at upper and lower surfaces of a metamaterial system, determine heat flux through the system, and calculate the thermal conductance of the system. Fourier's Law is $$q = -K(T_1 - T_2)/s \qquad \text{Eq. (5)}$$

Here, Fourier's Law is used in an average sense, where $(T_1-T_2)$ is the temperature gradient applied across the thickness of the metamaterial system between upper and lower surfaces of its metamaterial structure, and K is the conductance of the metamaterial structure of the system.

For the heat transfer problem, predefined temperature gradients of $\Delta T=10°$ C. are applied. The material of the metamaterial core was considered as an elasto-plastic with a yield strength $\sigma_{yield}=200$ MPa. The contact pressure resulted from the differential thermal expansion of the core material when the temperature increased relative to a stress-free initial reference temperature equal to 20° C., so the metamaterial structure under this condition is self-adjustable in conductivity.

Figure 5:
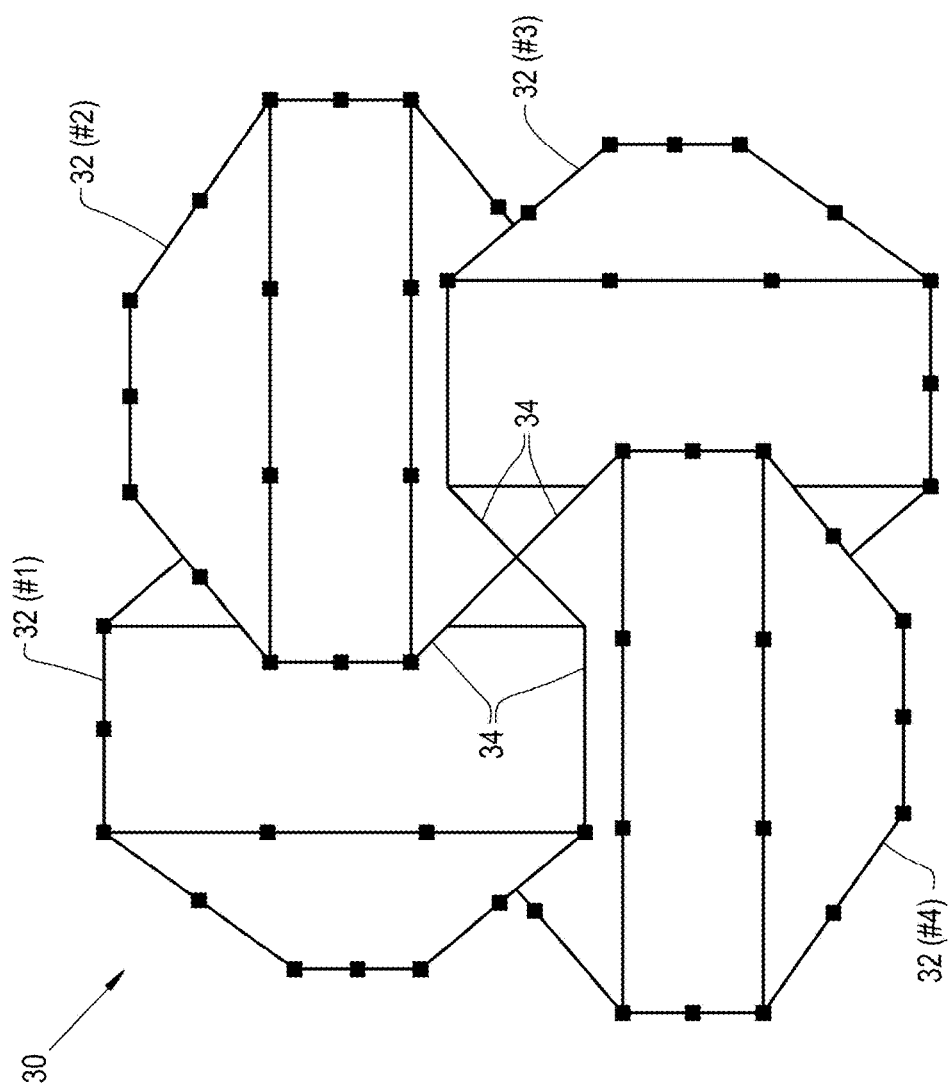
FIG. 5 schematically represents a pseudo-tetrahedra structural unit assembly of elements suitable for use as part of a metamaterial core in accordance with a nonlimiting embodiment of the invention.

FIG. 5 represents a top view schematic of a basic structural unit assembly 30 considered during the investigations. The assembly 30 represents a portion of a pseudo-tetrahedral metamaterial structure for a metamaterial core, for example, of a type represented in FIGS. 3 and 4. The assembly 30 includes four pseudo-tetrahedral elements 32, though fewer or greater numbers of elements 32 could be present. The elements 32 are configured and arranged to define contact interfaces 34 therebetween. For the sake of discussion, the elements 32 represented in FIG. 5 are designated as #1, #2, #3 and #4, with #1 and/or #2 being designated as the element(s) 32 contacting an upper plate (not shown) of the metamaterial system and #3 and/or #4 designated as the element(s) 32 contacting a lower plate (not shown) of the system. As a result of the pseudo-tetrahedral shapes of the elements 32, the contact interfaces 34 advantageously provide surface-to-surface contact between interfacing elements 32. Additionally, the elements 32 define outer contact surfaces 36 that provide surface-to-surface contact with the upper and lower plates.

Figure 6:
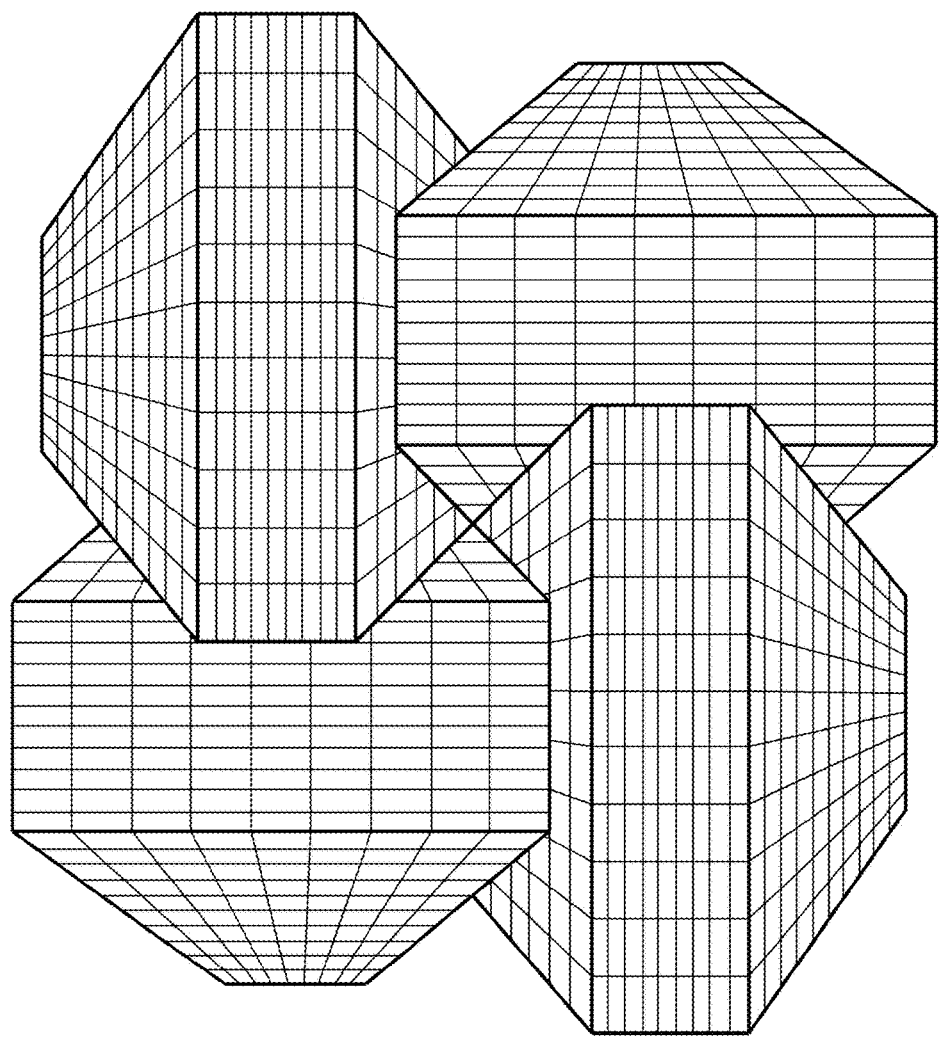
FIG. 6 schematically represents a finite element model of the structural unit assembly of FIG. 5.

FIG. 6 schematically represents a finite element model of the structural unit assembly 30 depicted in FIG. 5. The finite element model of the structural unit assembly 30 was used to generate a model of the entire metamaterial structure being evaluated. The model can be used to determine temperature distribution, heat flux, forces, stresses, strain and other useful parameters associated with the core and its metamaterial structure and frame.

Figure 7A:
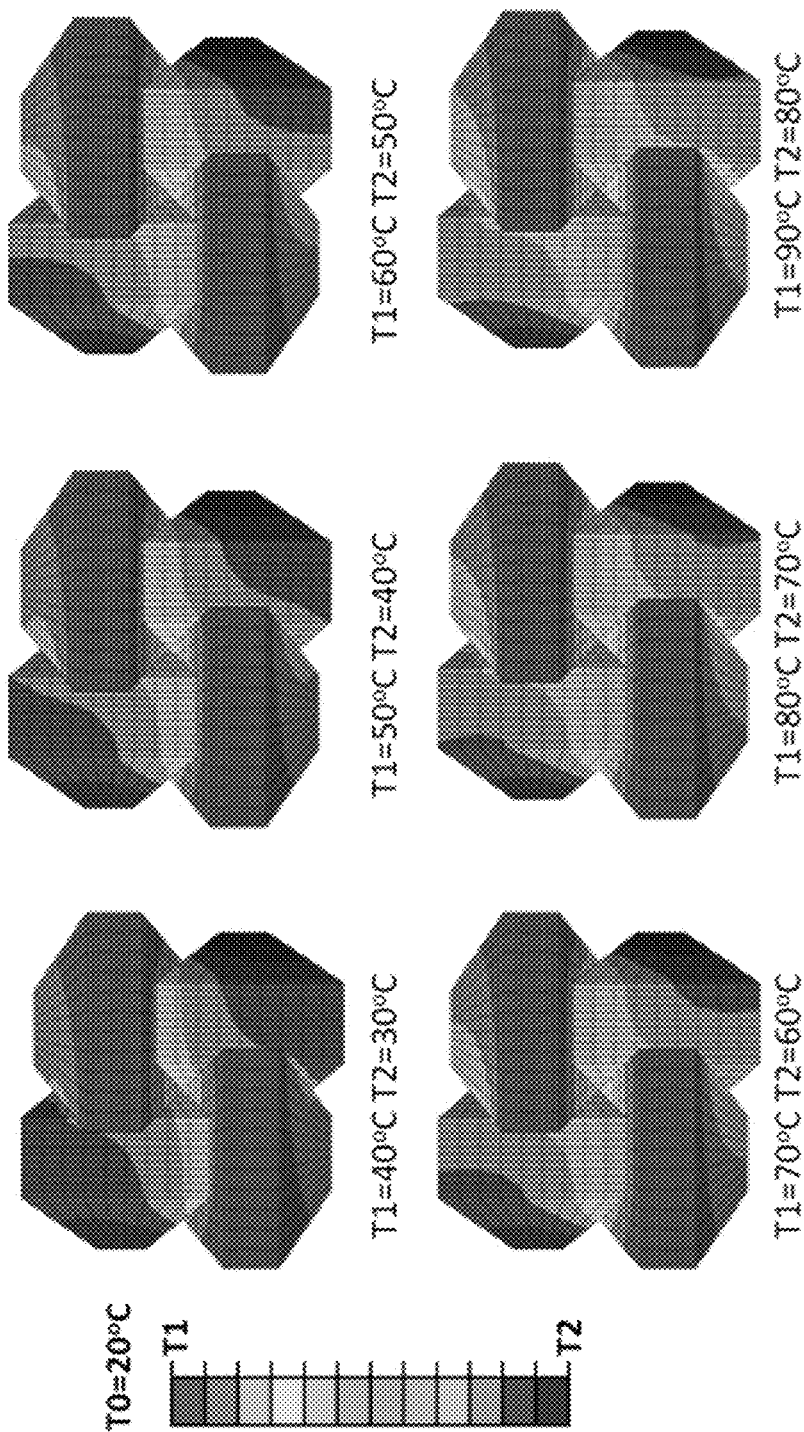
FIG. 7a represents predicted temperature distributions across the structural unit assembly of FIGS. 5 and 6 under different temperature differentials.

FIG. 7a represents predicted temperature distributions across the structural unit assembly 30 of FIGS. 5 and 6 under different temperature differentials. The offset arrangement of the elements 32 forces the heat flux from the upper set of elements 32 (#1 and/or #2 contacting the upper plate of the metamaterial system) to the other set of elements 32 (#3 and/or #4 contacting the lower plate of the metamaterial system) across their contact interfaces 34. The overall heat flux path therefore is across these interfaces 34 and is consequently altered by the contact pressure between the elements 32 and their interfaces 34 therebetween.

Figure 7B:
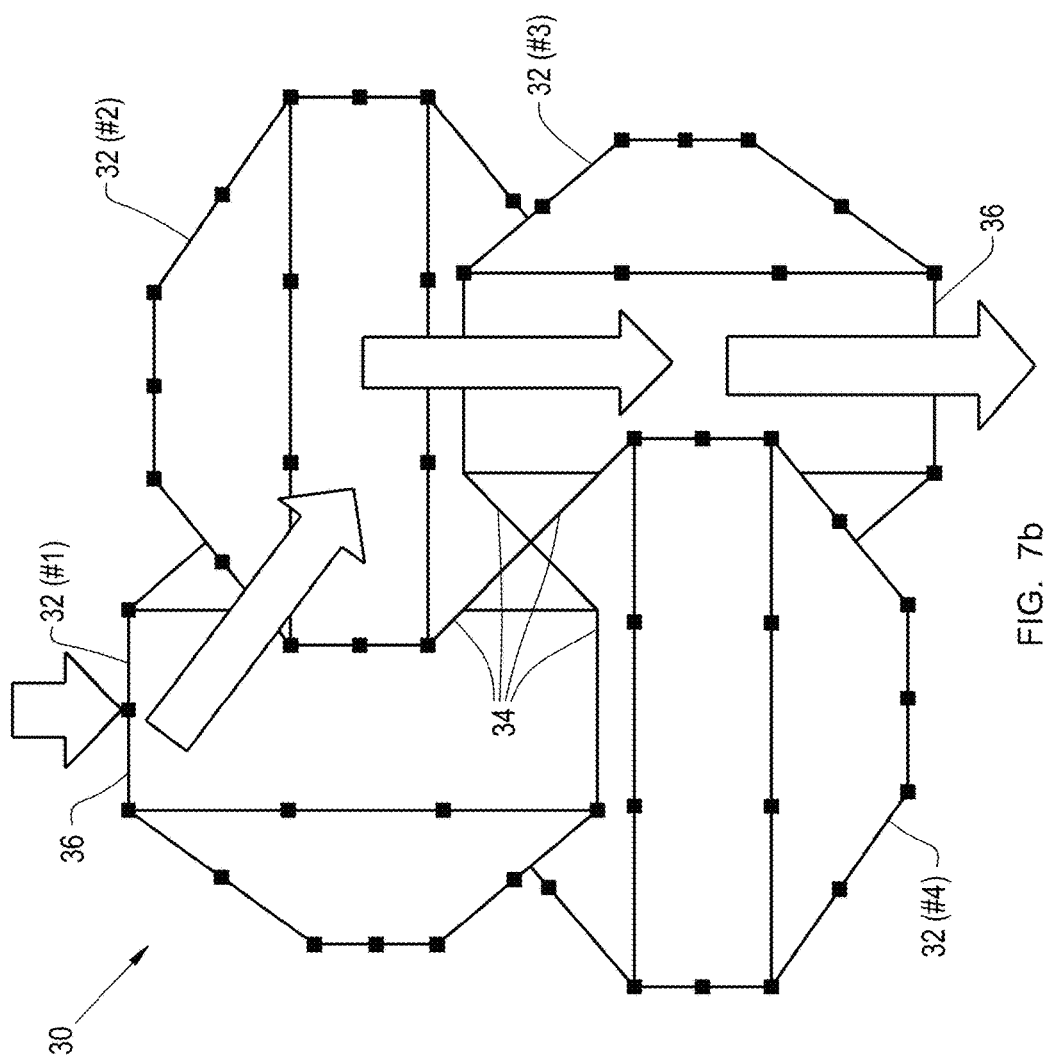
FIG. 7b schematically represents a staggered directional heat flow path through the structural unit assembly of FIGS. 5 and 6.

Referring to FIG. 7b, an exemplary staggered directional heat flow path through the assembly 30 is depicted. It should be noted that, because of the staggered nature of the elements 32, heat flow entering the assembly 30 through element #1 does not exit the assembly 30 via element #4. Instead, some of the heat flow exits the assembly 30 via element #3, and the remainder through other elements 18 (not shown) of the metamaterial structure. The staggering of the elements 32 is the result of truncation of tetrahedron elements with at least two levels: a top portion truncated at a first level and a bottom portion truncated at a second level larger than the first level, as further described below.

Figure 8B:
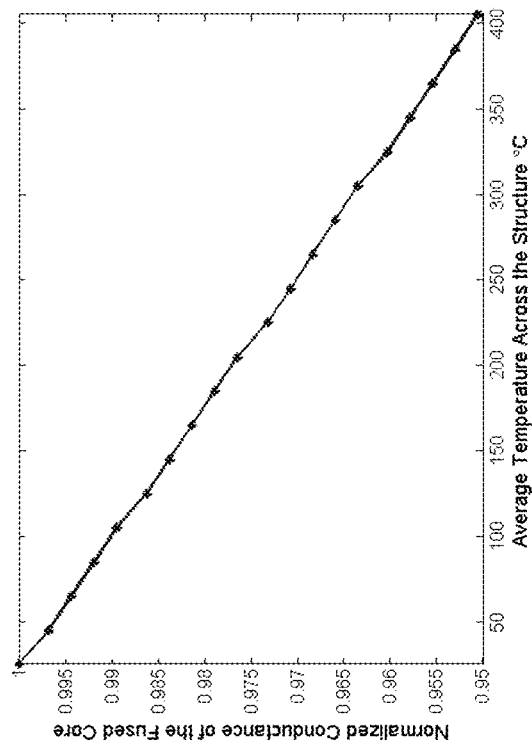
FIG. 8a plots predicted thermal conductance with respect to temperature for a metamaterial structure of the type represented in FIGS. 5, 6, and 7b, and FIG. 8b plots predicted thermal conductance with respect to temperature for a non-metamaterial structure.
Figure 8A:
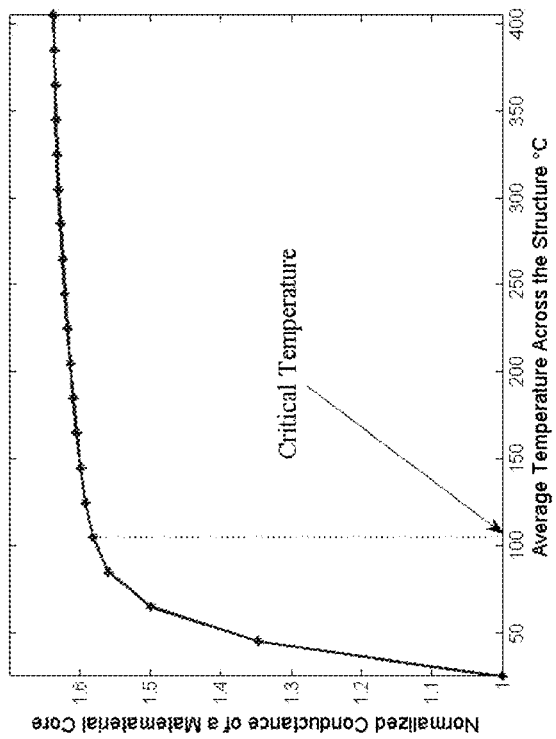

FIG. 8*a* depicts the resulting normalized thermal conductance across the assembly 30 with respect to temperature, indicating a thermal response characterized by a variable thermal conductivity and a positive correlation between thermal conductivity and temperature. It should be noted that the resulting variable thermal conductivity represented in FIG. 8*a* is but one exemplary outcome based on the chosen dimensions, materials, and other configurations depicted in FIG. 5. Other outcomes are possible by manipulating dimensions (e.g., cutoff portions of the truncated tetrahedra structures) and materials of the elements and frame, the level and other characteristics of external confinement forces applied by the frame (compression-inducer member), etc. Therefore, thermal conductivity and its response evident from FIG. 8*a* can be seen as thermal parameters that can be tunable with respect to temperature (an external stimulus) utilizing the structures and arrangements presented in FIG. 5, and the thermal response shown in FIG. 8*a* can be modified and tuned to a desired response. A limit to reversibility of the system behavior exists due to the potential for plastic deformation at temperatures that are high relative to the initial stress free configuration. Once that critical temperature difference is exceeded, the temperature dependence of the metamaterial structure is no longer altered and no longer reversible.

To further show the effect of metamaterial structures of types described herein, the normalized thermal conductance vs. temperature response of FIG. 8*a* can be compared with the normalized thermal conductance of a bulk material analyzed under identical conditions. FIG. 8*b* depicts the normalized thermal conductance across a baseline system composed of upper and lower plates and a monolithic core structure (i.e., a non-metamaterial structure as compared to metamaterial structures described herein). The material properties, loading conditions, and geometries are the same as those of the metamaterial structure discussed in relation to FIGS. 5, 6, 7*a* and 7*b*. As evident from FIG. 8*b*, the thermal conductance of the baseline system decreased with increasing temperature, as would be expected for a conventional bulk material.

It should be appreciated that the elements 32 of the pseudo-tetrahedra metamaterial structure depicted in FIG. 5 are advantageously configured to provide surface-to-surface contact with upper and lower plates. This arrangement is to be contrasted with a tetrahedra metamaterial structure 40 depicted in FIG. 9, in which the structure 40 comprises tetrahedra elements 42 configured to only make contact with upper and lower plates by lines of contact at edges 44 of individual elements 42. One way to parameterize the difference between the tetrahedra structure 40 of FIG. 9 and a pseudo-tetrahedra structure represented by the assembly 30 of FIG. 5 is by comparing volume to surface area of their respective elements.

Figure 10A:
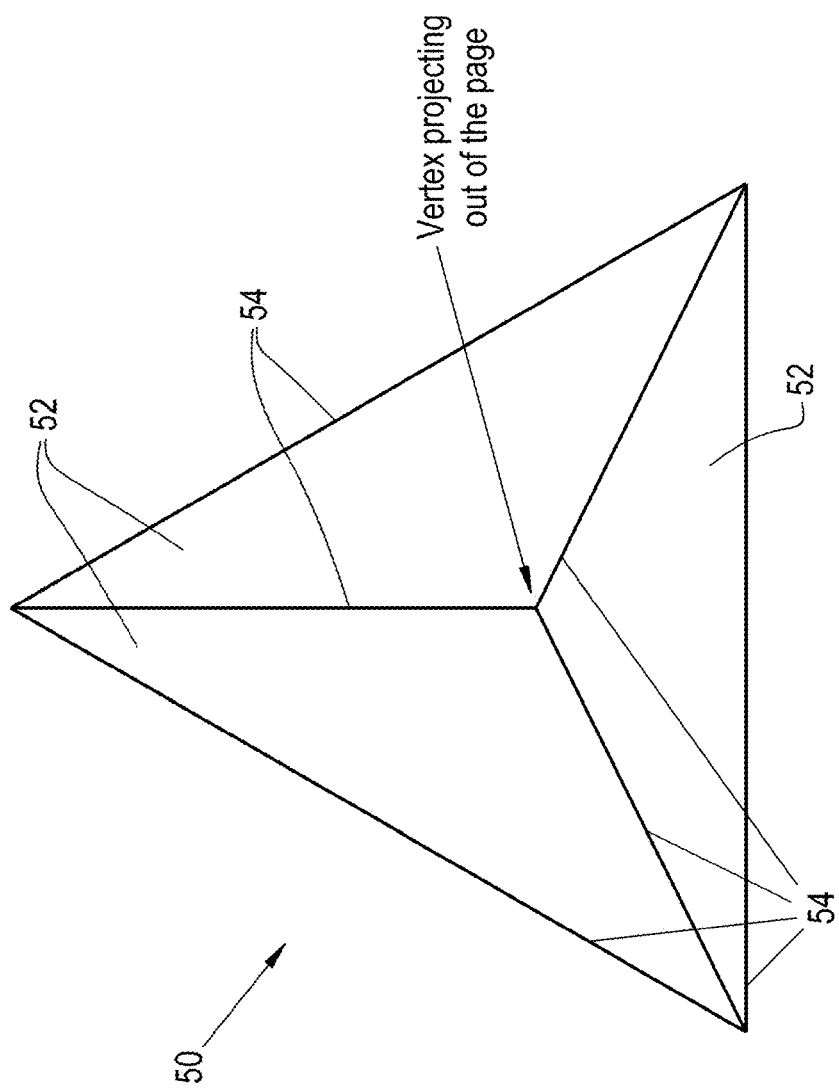
FIGS. 10a and 10b schematically represent an individual element of the structural unit assembly of FIG. 9.
Figure 10B:
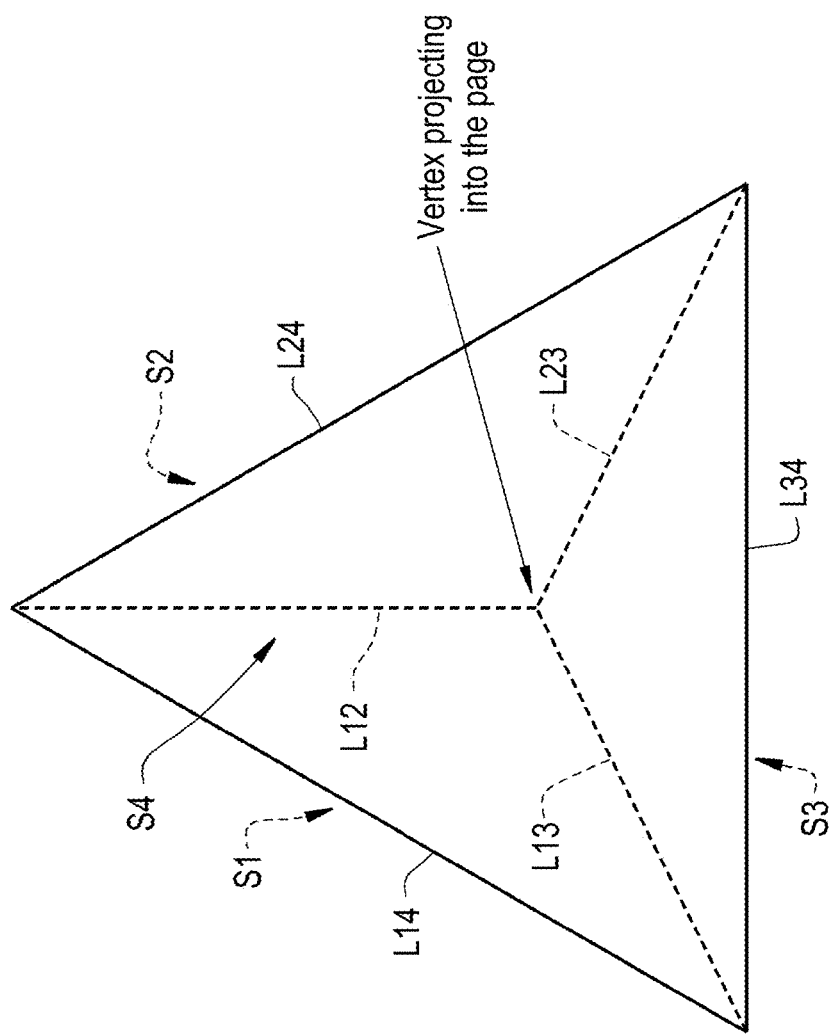

Referring to FIG. 10*a*, a tetrahedron 50 is depicted, with its vertex projecting out of the page. The tetrahedron 50 of FIG. 10*a* conventionally includes four triangles 52 (three of which are visible) and six edges 54 where the triangles 52 meet. Referring to FIG. 10*b*, the tetrahedron 50 of FIG. 10*a* is rotated so that the vertex is projecting into the page. The four triangles 52 are identified as S1, S2, S3, and S4. The edges 54 are identified as L12, L13, L14, L23, L24, and L34.

Assuming that the edge length of the regular tetrahedron is $a_0$, the area of one side (triangle) is:

$$S_{triangle} = \sqrt{p(p-a)(p-b)(p-c)}$$
$$= \sqrt{\frac{3a_0}{2}\left(\frac{3a_0}{2} - a_0\right)^3}$$
$$= \frac{\sqrt{3}}{4}a_0^2.$$

Therefore, the total triangle area of one regular tetrahedron is:

$$S_{tet} = 4 \times S_{triangle} = \sqrt{3}a_0^2.$$

The height of a regular tetrahedron (surface to vertex) is:

$$h = \frac{\sqrt{6}}{3}a_0,$$

so the volume is:

$$V_{tet} = \frac{1}{3}h \times S_{triangle}$$
$$= \frac{1}{3} \times \frac{\sqrt{3}}{4} \times \frac{\sqrt{6}}{3}a_0^3$$
$$= \frac{\sqrt{2}}{12}a_0^3.$$

The ratio of surface to volume is:

$$R_{tet} = \frac{S_{tet}}{V_{tet}}$$
$$= \sqrt{3}a_0^2 \Big/ \frac{\sqrt{2}}{12}a_0^3$$
$$= \frac{6\sqrt{6}}{a_0}$$
$$\approx \frac{14.70}{a_0}.$$

Referring to FIG. 11, schematic and perspective views of a tetrahedra structural unit assembly are depicted. For each contact pair, since the four triangles (1, 2, 3, 4) are substantially identical, a reduction in area results which is the area of a triangle of a tetrahedron:

$$S_{reduction\text{-}tet} = 2 \times (S_1 \times S_3)$$
$$= S_{triangle}$$
$$= \frac{\sqrt{3}}{4}a_0^2$$
$$= \frac{1}{4}S_{tet},$$

and the contact area is:

$$S_{contact\text{-}tet} = S_1 + S_3$$

-continued $$= \frac{1}{2} S_{reduction-tet}$$

$$= \frac{\sqrt{3}}{8} a_0^2$$

$$= \frac{1}{8} S_{tet}.$$

For an N×N tetrahedra assembly, the reduction in area can be separated into two parts: the reduction resulting from the interelement contact and the reduction resulting from the tetrahedron-frame (metamaterial structure and compression-inducer member) contact. For the interelement contact:

$$S_{reduction\_in\text{-}tet} = (N-1)^2 \times S_{triangle}$$

$$= \frac{(N-1)^2}{4} S_{tet}.$$

For the tetrahedron-frame contact:

$$S_{reduction\_out\text{-}tet} = 4N \times \frac{S_{triangle}}{4} = \frac{N}{4} \times S_{tet}.$$

So the total area reduction is:

$$S_{reduction\text{-}tet} = S_{reduction\_in\text{-}tet} + S_{reduction\_out\text{-}tet} = \frac{(N-1)^2 + N}{4} \times S_{tet}.$$

Therefore the true surface to volume ratio is $$R_{Assembly\_N \times N\text{-}tet} = \frac{N^2 \times S_{tet} - \frac{(N-1)^2 + N}{4} \times S_{tet}}{N^2 \times V_{tet}}$$

$$= \frac{3N^2 + N - 1}{4N^2} \frac{S_{tet}}{V_{tet}}$$

$$= \frac{3N^2 + N - 1}{4N^2} \frac{6\sqrt{6}}{a_0}$$

Using N=7, as an example, $$R_{Assembly\_N \times N\text{-}tet} \xrightarrow{N=7} = 0.781 \times \frac{6\sqrt{6}}{a_0} = \frac{11.473}{a_0}.$$

Figure 12A:
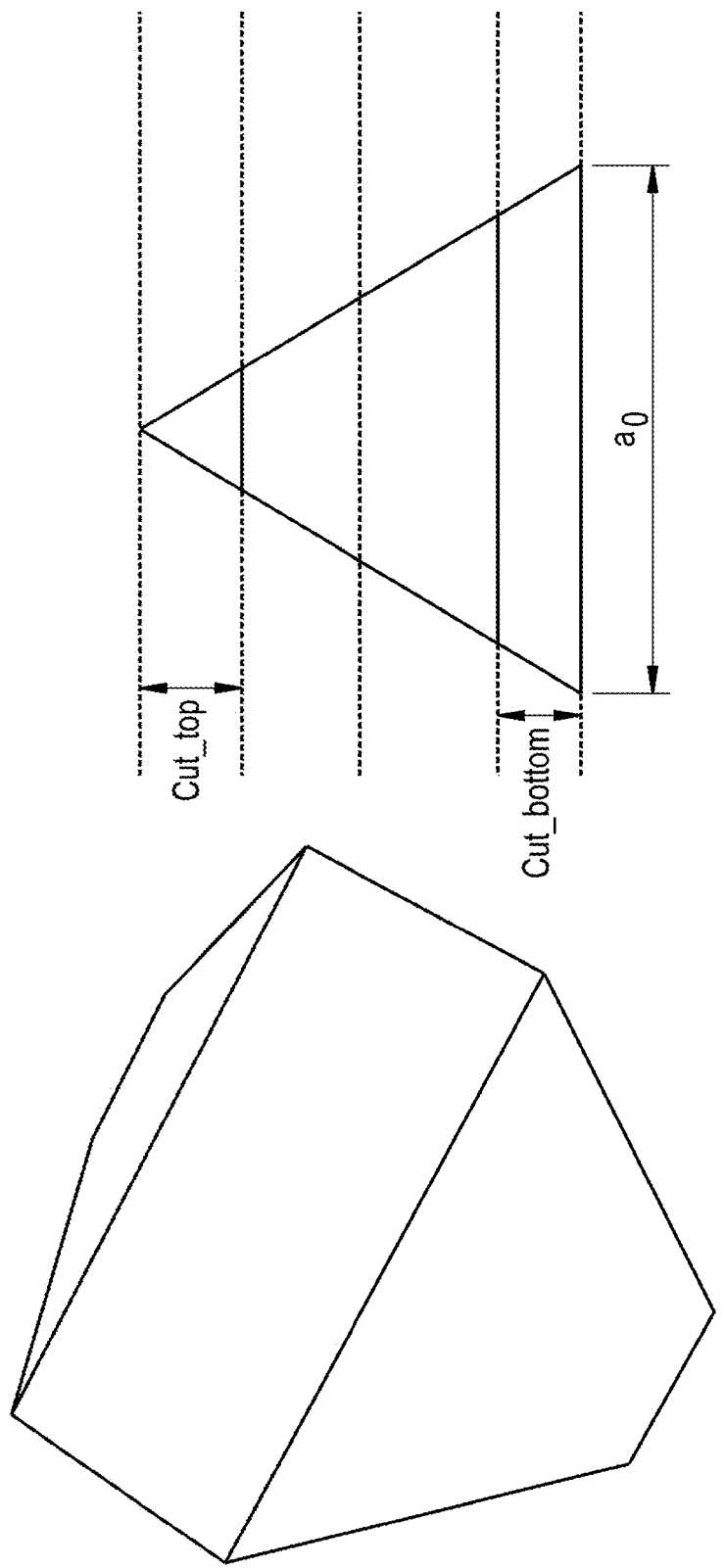
FIGS. 12a through 12f represent perspective and schematic views of individual pseudo-tetrahedra elements generated by truncating a tetrahedron of the type represented in FIGS. 10 and 10b.
Figure 12B:
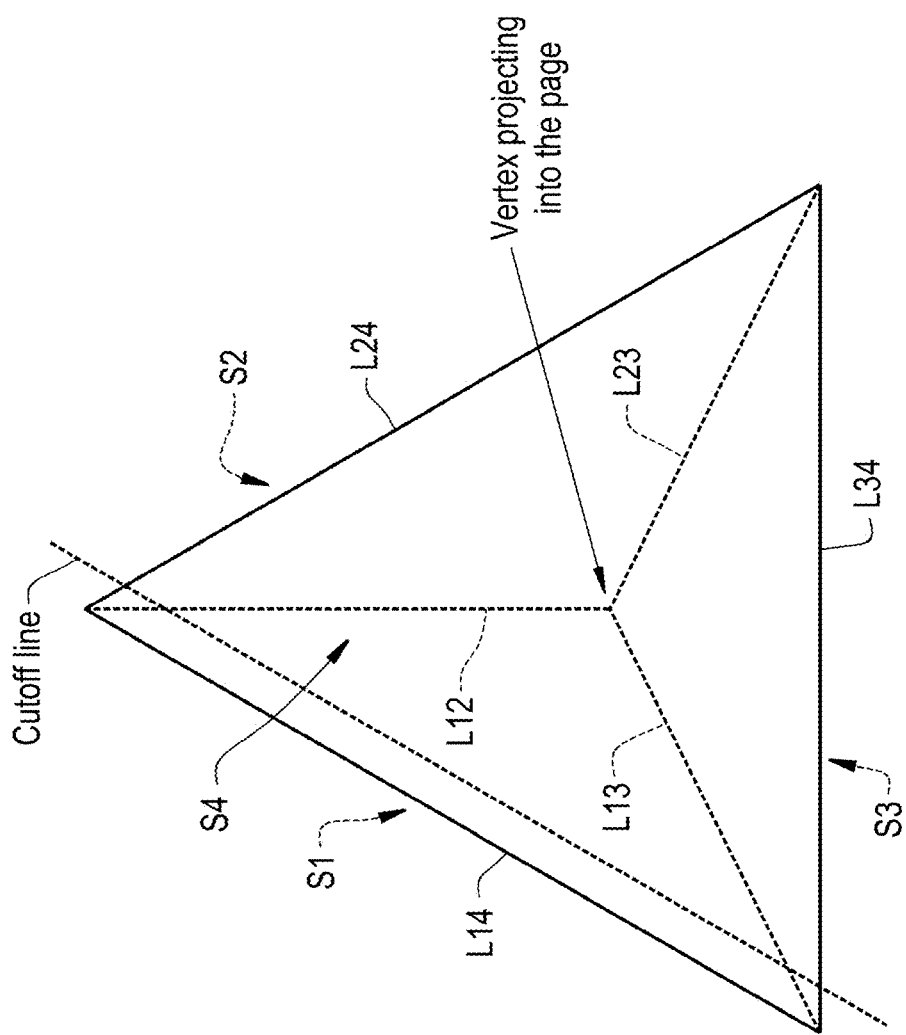
Figure 12D:
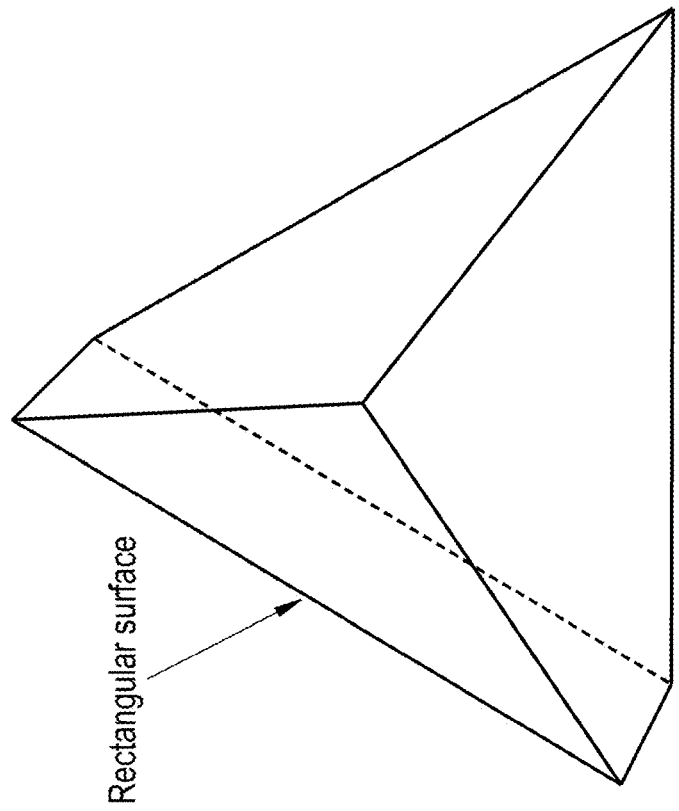
Figure 12C:
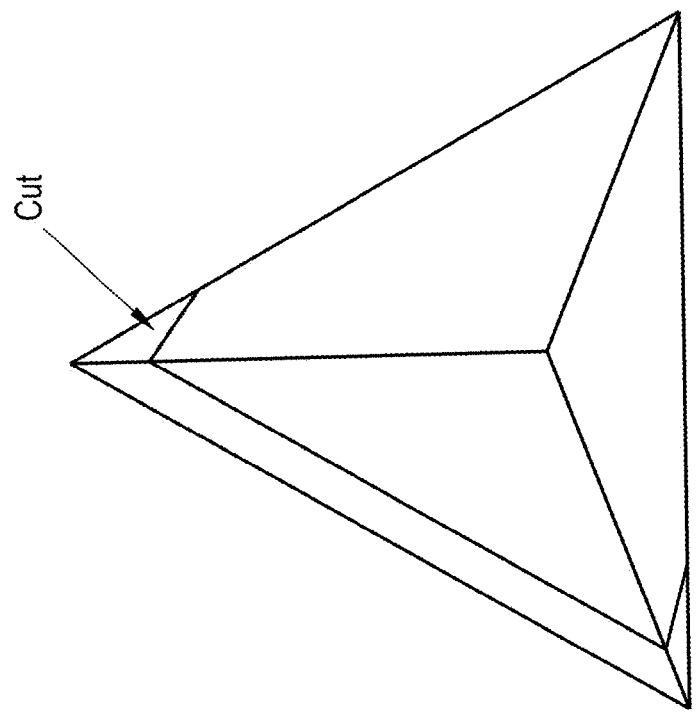
Figure 12F:
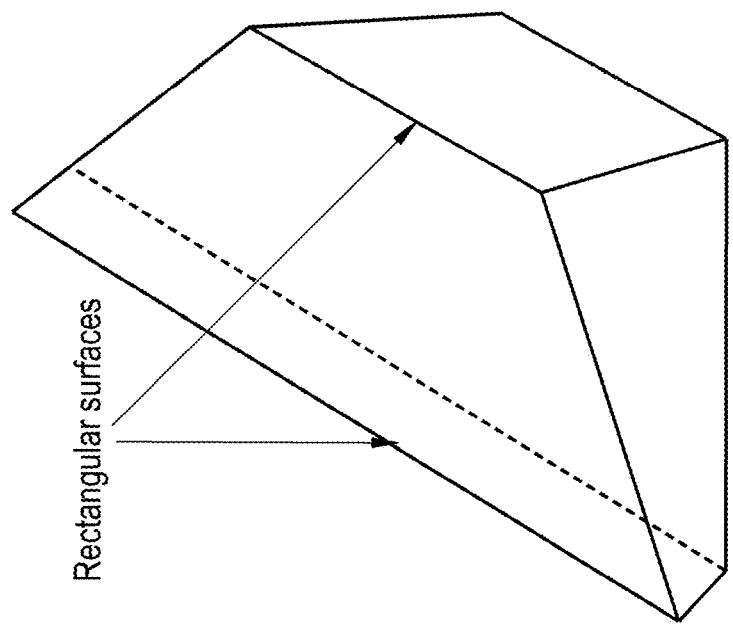
Figure 12E:
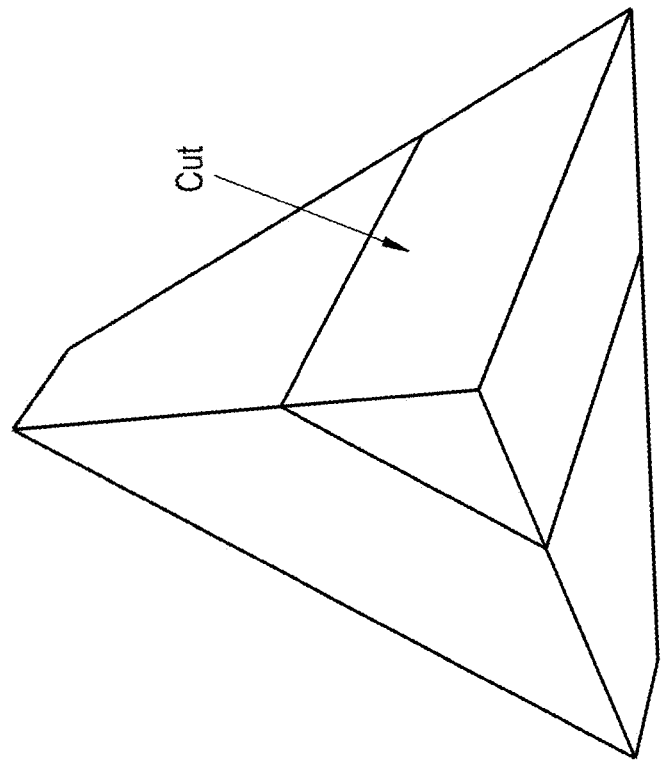

In contrast, the pseudo-tetrahedra structure of FIG. 5 comprises elements 32 that are each a pseudo-tetrahedron, in other words, a tetrahedron with portions thereof removed to yield a truncated tetrahedron. Referring to FIG. 12a, a pseudo-tetrahedra structure (schematic and perspective views) is depicted as resulting from portions of a tetrahedron being removed to yield a truncated tetrahedron (identified herein as Cut_top and Cut_bottom). Referring to FIG. 12b, the truncation (cut-off) of the tetrahedron is depicted according to one embodiment. In FIG. 12b, the tetrahedron shown in FIG. 10b is depicted with a line showing a planar cut being made parallel with one of the edges (e.g., L14). FIGS. 12c and 12d depict perspective views of the tetrahedron depicted in FIG. 10a (i.e., with the vertex projecting out of the page) with the cut being made parallel to the left edge, resulting in a four-sided surface being generated after the cut. This cut, as discussed below, is designated as a first-level cut, Cut_top, and represents a percentage of $a_0$ (the edge length of the original tetrahedron of FIG. 12c). FIGS. 12e and 12f depict another cut made in the truncated tetrahedron of FIG. 12d along a plane parallel to the four-sided surface generated with the first cut (FIG. 12c). This second cut, as discussed below, is designated a second-level cut, Cut_bottom, and also represents a percentage of $a_0$ (the edge length of the tetrahedron). The resulting pseudo (truncated) tetrahedral structure includes four trapezoidal surfaces and two rectangular surfaces that are parallel to each other.

With the pseudo-tetrahedron described above, and Cut_top<Cut_bottom, the surface area of the pseudo-tetrahedron is:

$$S_{pseudo-tet} = 2S_{trapezoid\_1} + 2S_{trapezoid\_2} + S_{rectangle\_1} + S_{rectangle\_2}$$

$$S_{trapezoid\_1} = \frac{(1 - \text{cut\_bottom})^2 - \text{cut\_top}^2}{4} S_{tet}$$

$$S_{trapezoid\_2} = \frac{(1 - \text{cut\_bottom})^2 - \text{cut\_bottom}^2}{4} S_{tet}$$

$$S_{rectangle\_1} = \frac{\sqrt{3}}{3}(1 - \text{cut\_top}) \times \text{cut\_top} \times S_{tet}$$

$$S_{rectangle\_2} = \frac{\sqrt{3}}{3}(1 - \text{cut\_bottom}) \times \text{cut\_bottom} \times S_{tet}$$

$$S_{pseudo-tet} = 2 \times \frac{(1 - \text{cut\_bottom})^2 - \text{cut\_top}^2}{4} S_{tet} +$$

$$2 \times \frac{(1 - \text{cut\_top})^2 - \text{cut\_bottom}^2}{4} S_{tet} +$$

$$\frac{\sqrt{3}}{3}(1 - \text{cut\_top}) \times \text{cut\_top} \times S_{tet} +$$

$$\frac{\sqrt{3}}{3}(1 - \text{cut\_bottom}) \times \text{cut\_bottom} \times S_{tet}$$

$$= \left[ 1 - \frac{3 - \sqrt{3}}{3}(\text{cut\_bottom} + \text{cut\_top}) - \frac{\sqrt{3}}{3}(\text{cut\_top}^2 + \text{cut\_bottom}^2) \right] S_{tet}$$

The volume of the pseudo-tetrahedron is:

$$V_{pseudo-tet} = V_{tet} - V_{wedge\_1} - V_{wedge\_2}$$

$$V_{tet} = \frac{\sqrt{2}}{12} a_0^3$$

$$V_{wedge\_1} = \frac{1}{6}[2(1 - \text{cut\_top})a_0 + a_0] \times$$

$$\text{cut\_top} \times a_0 \times \frac{\sqrt{2}}{2} \times \text{cut\_top} \times a_0$$

$$= \frac{\sqrt{2}}{12} a_0^3 (3 - 2\text{cut\_top}) \times \text{cut\_top}^2$$

$$= (3 - 2\text{cut\_top}) \times \text{cut\_top}^2 \times V_{tet}$$

$$V_{wedge\_2} = (3 - 2\text{cut\_bottom}) \times \text{cut\_bottom}^2 \times V_{tet}$$

-continued $$V_{pseudo-tet} = V_{tet} - (3 - 2\text{cut\_top}) \times \text{cut\_top}^2 \times V_{tet} - (3 - 2\text{cut\_bottom}) \times \text{cut\_bottom}^2 \times V_{tet}$$

$$= \frac{\sqrt{2}}{12}a_0^3 \begin{bmatrix} 1 - \text{cut\_top}^2(3 - 2\text{cut\_top}) - \\ \text{cut\_bottom}^2(3 - 2\text{cut\_bottom}) \end{bmatrix}$$

$$= \begin{bmatrix} 1 - \text{cut\_top}^2(3 - 2\text{cut\_top}) - \\ \text{cut\_bottom}^2(3 - 2\text{cut\_bottom}) \end{bmatrix} \times V_{tet}$$

So the surface to volume ratio of the pseudo-tetrahedron is:

$$R_{pseudo-tet} = \frac{1 - \frac{3-\sqrt{3}}{3}(\text{cut\_bottom} + \text{cut\_top}) - \frac{\sqrt{3}}{3}(\text{cut\_top}^2 + \text{cut\_bottom}^2)}{1 - \text{cut\_top}^2(3 - 2\text{cut\_top}) - \text{cut\_bottom}^2(3 - 2\text{cut\_bottom})} \frac{S_{tet}}{V_{tet}}$$

$$= \frac{1 - \frac{3-\sqrt{3}}{3}(\text{cut\_bottom} + \text{cut\_top}) - \frac{\sqrt{3}}{3}(\text{cut\_top}^2 + \text{cut\_bottom}^2)}{1 - \text{cut\_top}^2(3 - 2\text{cut\_top}) - \text{cut\_bottom}^2(3 - 2\text{cut\_bottom})} \frac{6\sqrt{6}}{a_0}$$

$$R_{pseudo-tet} \xrightarrow[\text{cut\_bottom}=30\%]{\text{cut\_top}=20\%} = 1.049 \frac{S_{tet}}{V_{tet}} = \frac{15.424}{a_0}$$

The contact surface area of a pseudo-tetrahedra structure comprising two pseudo-tetrahedrons can be considered as two identical isosceles trapezoids, as depicted in FIG. 13 (including schematic and perspective views). As such, the contact surface areas are:

$$S_{contact-pseudo-tet} = 2S_{trapezoid}$$

$$= \frac{\sqrt{3}}{8}a_0^2(1 - 4 \times \text{cut\_bottom}^2)$$

$$= \frac{1 - 4 \times \text{cut\_bottom}^2}{8} S_{tet}.$$

And the area reduction is:

$$S_{reduction-pseudo-tet} = 2S_{contact-pseudo-tet}$$

$$= \frac{\sqrt{3}}{4}a_0^2(1 - 4 \times \text{cut\_bottom}^2)$$

$$= \frac{1 - 4 \times \text{cut\_bottom}^2}{4} S_{tet}.$$

As an example, for a second-level (bottom portion) cut of 30% of the edge length $a_0$:

$$R_{contact-pseudo-tet} \xrightarrow{\text{cut\_bottom}=30\%} = 0.64 \times \frac{\sqrt{3}}{8}a_0^2 \approx 0.139a_0^2$$

The reduction in surface and the surface to volume ratio of the pseudo-tetrahedra metamaterial structure 20 depicted in FIG. 4 (i.e., for N×N) can be separated into two parts: the reduction resulting from the interelement contact and the reduction resulting from the tetrahedron-frame contact:

For the interelement contact:

$$S_{reduction\_in-pseudo-tet} = (N-1)^2 S_{reduciton-pseudo-tet}$$

$$= (N-1)^2 \frac{1 - 4 \times \text{cut\_bottom}^2}{4} S_{tet}.$$

For the tetrahedron-frame contact:

$$S_{reduction\_out-pseudo-tet} = 4N \times S_{trapezoid}$$

$$= N \times \frac{1 - 4\text{cut\_bottom}^2}{4} S_{tet}.$$

So the total area reduction is:

$$S_{reduction-assembly-pseudo-tet} = S_{reduction\_in-pseudo-tet} + S_{reduction\_out-pseudo-tet}$$

$$= (N-1)^2 \frac{1 - 4 \times \text{cut\_bottom}^2}{4} S_{tet} + N \times \frac{1 - 4\text{cut\_bottom}^2}{4} S_{tet}$$

$$= (N^2 - N + 1) \frac{1 - 4 \times \text{cut\_bottom}^2}{4} S_{tet}$$

$$\xrightarrow[\text{cut\_bottom}=30\%]{N=7} = 43 \times \frac{0.64}{4} S_{tet} \approx 11.92a_0^2$$

Therefore the surface to volume ratio is:

$$R_{Assembly\_N \times N-pseudo-tet} = \frac{N^2 \times S_{pseudo-tet} - S_{reduction-assembly-pseudo-tet}}{n^2 \times V_{pseudo-tet}}$$

$$= \frac{\left\{\begin{array}{c} 1 - \frac{3-\sqrt{3}}{3}(\text{cut\_bottom} + \text{cut\_top}) - \\ \frac{\sqrt{3}}{3}(\text{cut\_top}^2 + \text{cut\_bottom}^2) - \\ \frac{1 - 4 \times \text{cut\_bottom}^2}{4} \frac{N^2 - N + 1}{N^2} \end{array}\right\}}{1 - \text{cut\_top}^2(3 - 2\text{cut\_top}) - \text{cut\_bottom}^2(3 - 2\text{cut\_bottom})} \frac{S_{tet}}{V_{tet}}$$

$$= \frac{\left\{\begin{array}{c} 1 - \frac{3-\sqrt{3}}{3}(\text{cut\_bottom} + \text{cut\_top}) - \\ \frac{\sqrt{3}}{3}(\text{cut\_top}^2 + \text{cut\_bottom}^2) - \\ \frac{1 - 4 \times \text{cut\_bottom}^2}{4} \frac{N^2 - N + 1}{N^2} \end{array}\right\}}{1 - \text{cut\_top}^2(3 - 2\text{cut\_top}) - \text{cut\_bottom}^2(3 - 2\text{cut\_bottom})} \frac{6\sqrt{6}}{a_0}$$

Based on the above analysis, it is believed that the first-level cut is preferably between 0.1% to 49% of the edge length $a_0$, and the second-level cut is preferably between 0.2% to 49.9% of the edge length $a_0$. For an example in which the first-level cut is 20% and the second-level cut is 30% of the edge length $a_0$, the surface to volume ratio is:

$$R_{Assembly\_N \times N-pseudo-tet} \xrightarrow[\substack{cut\_top=20\% \\ cut\_bottom=30\%}]{N=7} = 0.843 \frac{S_{tet}}{V_{tet}} = \frac{12.389}{a_0}$$

Figure 14:
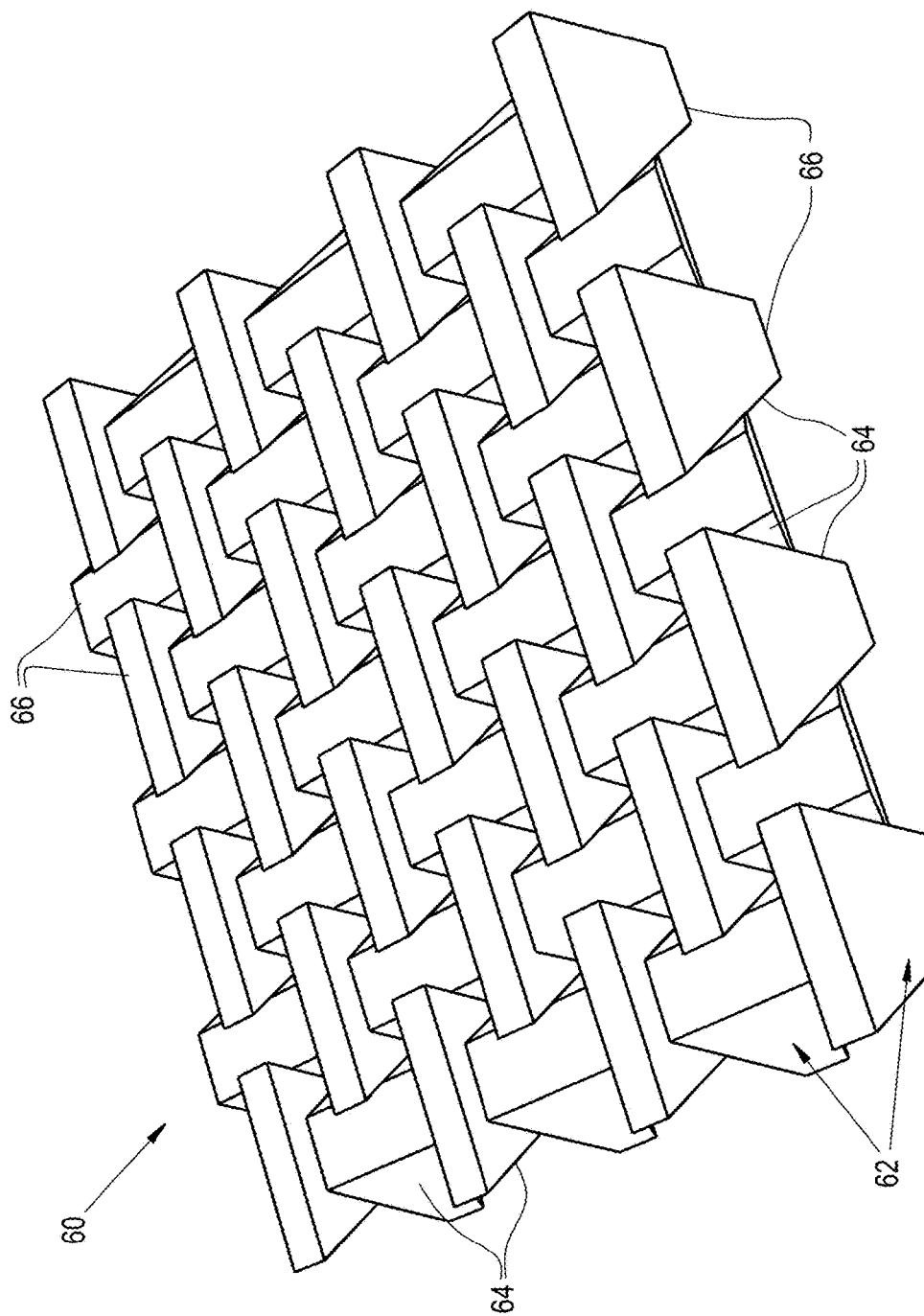
FIG. 14 represents a perspective view of a pseudo-tetrahedral metamaterial structure comprising pseudo-tetrahedral elements in accordance with another nonlimiting embodiment of the invention.

Referring to FIG. 14, a metamaterial structure 60 comprising a plurality of elements 62 is depicted, with the elements 62 coupled to each other and staggered with respect to one another. The elements 62 are configured in the manner represented in FIGS. 12*f* and 13. As such, each of the elements 62 has planar surfaces that define contact interfaces 64 with adjacent elements 62 physically and thermally coupled therewith, as well as contact surfaces 66 by which the structure 60 is able to be physically and thermally coupled with other structures and bodies, for example, plates of the types discussed previously. In the configuration represented in FIG. 14, the contact interfaces 64 are defined by the two parallel rectangular surfaces discussed in reference to FIGS. 12*f* and 13, and the contact surfaces 66 are defined by the four trapezoidal surfaces discussed in reference to FIGS. 12*f* and 13. This structure 60 is representative of the metamaterial structure 20 depicted in FIG. 4.

Figure 9:
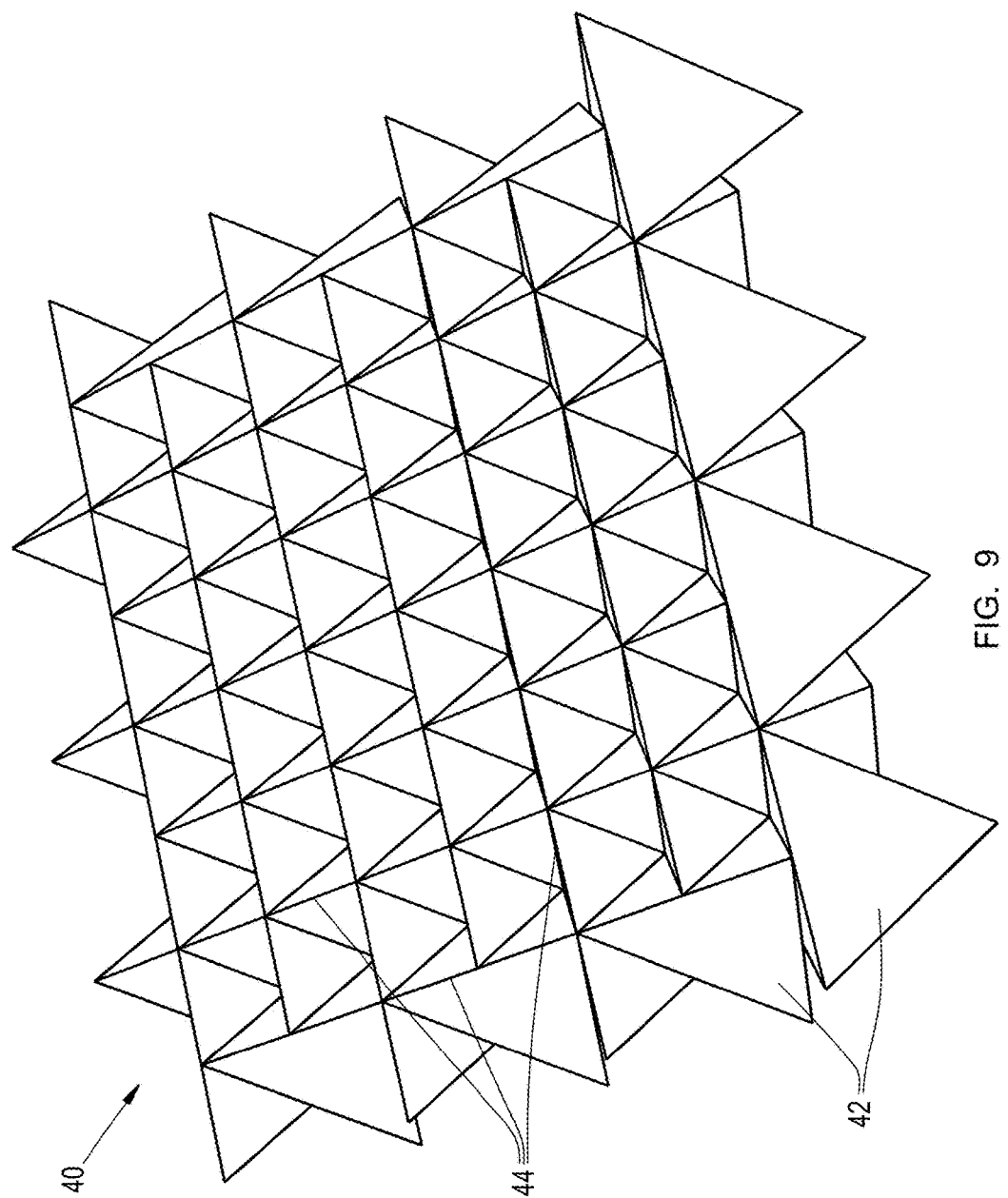
FIG. 9 schematically represents a tetrahedra metamaterial structure comprising tetrahedral elements.

The above relationships can be used to establish the volume to surface area parameters that can be used to distinguish a pseudo-tetrahedra structure of a type represented in FIG. 4 from the tetrahedra structure of a type represented in FIG. 9. These relationships show that the tetrahedra structure of FIG. 9 possesses a ratio of surface to volume that is $11.47/a_0$, and the pseudo-tetrahedra structure of FIG. 4 possesses a ratio of surface to volume that is $12.4/a_0$, where $a_0$ is the length of the edge of a tetrahedron. Surface to volume ratio relates to the surface area of the elements (e.g., 18 and 62) available for contact interfaces (e.g., 34 and 64) and contact surfaces (e.g., 36 and 66). From the analysis reported above, it is believed that effective surface to volume ratios for pseudo-tetrahedra structures utilized with the invention can be greater than $12/a_0$.

Metamaterial structures capable of exhibiting variable conductivities as described above can be useful in various systems as thermally-active structures and structures that experience gradients in temperature. Such systems include but are not limited to engines, satellites, battery systems, and fuel cells, particularly where an increase or decrease in thermal conductivity with a change in temperature can be detrimental to a thermally-active structure or structure that experiences a temperature gradient. In such a system, a metamaterial structure capable of exhibiting variable conductivity as described herein can function as a thermal fuse or valve to promote heat transfer, for example, that allows an influx or out flux of thermal energy, as may be desired by the structure or a system containing the structure.

While the invention has been described in terms of specific embodiments, it is apparent that other forms could be adopted by one skilled in the art. For example, physical configurations of the metamaterial structures and unit assemblies thereof could differ from those shown, and materials and processes/methods other than those noted could be used. Therefore, the scope of the invention is to be limited only by the following claims.

The invention claimed is:

1. A metamaterial system that exhibits variable conductivity, the system comprising:
   first and second plates;
   a metamaterial core between and thermally coupled to the first and second plates, the metamaterial core comprising a plurality of elements coupled to and contacting each other, each of the elements being a pseudo-tetrahedron having surfaces that define surface-to-surface contacts with at least one other of the elements; and
   means for contacting and exerting force on the metamaterial core that increases contact pressures between the elements at the surface-to-surface contacts of the surfaces of the elements and thereby increases thermal contact conductivities at the surface-to-surface contacts and increases a thermal conductivity of the metamaterial core.

2. The metamaterial system of claim 1, wherein the force exerted on the elements is a result of an external stimulus that is independent of temperature.

3. The metamaterial system of claim 2, wherein the external stimulus is an external mechanical force.

4. The metamaterial system of claim 1, wherein the force exerted on the elements is a result of an external stimulus that is dependent of temperature.

5. The metamaterial system of claim 4, wherein the external stimulus is a result of a difference in thermal expansion of the elements and the contacting and exerting means.

6. The metamaterial system of claim 1, wherein the contacting and exerting means comprises a frame that surrounds the elements.

7. A method of using a metamaterial system that exhibits variable conductivity and comprises:
   first and second plates;
   a metamaterial core between and thermally coupled to the first and second plates, the metamaterial core comprising a plurality of elements coupled to and contacting each other, each of the elements being a pseudo-tetrahedron having surfaces that define surface-to-surface contacts with at least one other of the elements; and
   means for contacting and exerting force on the metamaterial core that increases contact pressures between the elements at the surface-to-surface contacts of the surfaces of the elements and thereby increases thermal contact conductivities at the surface-to-surface contacts and increases a thermal conductivity of the metamaterial core;
   the method comprising:
   including the metamaterial core as a structure within a second system in which the metamaterial core is a thermally-active structure or is subjected to temperature gradients; and
   exerting forces on the metamaterial core to increase or decrease the thermal conductivity of the metamaterial core.

8. The method of claim 7, wherein the second system is an engine, satellite, battery system, or fuel cell and the forces exerted on the metamaterial core increase the thermal conductivity of the metamaterial core with increasing temperature.

9. The method of claim 7, wherein the metamaterial system functions as a thermal fuse or valve in the second system, and the forces exerted on the metamaterial core cause the metamaterial structure to exhibit variable conductivity that allows an influx or out flux of thermal energy to or from the second system.

10. A metamaterial system comprising:
    first and second spreader plates;
    a metamaterial core between and mechanically coupled to the first and second plates, the metamaterial core comprising a plurality of elements, each of the elements being coupled to and contacting at least one other of the elements, each of the elements being a pseudo-tetrahedron having surfaces that define surface-to-surface contacts with the at least one other of the elements, each of the pseudo-tetrahedra comprising two parallel rectangular surfaces and four trapezoidal surfaces; and a frame disposed around the metamaterial core, contacting at least some of the elements of the metamaterial core, and exerting confinement on the metamaterial core that increases contact pressures between the elements at the surface-to-surface contacts of the surfaces of the elements and thereby increases thermal contact conductivities at the surface-to-surface contacts and increases a thermal conductivity of the metamaterial core, the elements being arranged to transfer the force throughout the metamaterial core, the frame being configured to change in size in response to an external stimulus and thereby change the force exerted on the elements.

11. The metamaterial system of claim 10, wherein the external stimulus is independent of temperature.

12. The metamaterial system of claim 10, wherein the external stimulus is an external mechanical force.

13. The metamaterial system of claim 10, wherein the external stimulus is dependent of temperature.

14. The metamaterial system of claim 10, wherein the external stimulus is a result of a difference in thermal expansion of the elements and the frame.

15. The metamaterial system of claim 10, wherein each pseudo-tetrahedron is generated by truncating a tetrahedron having four triangular surfaces intersecting at six edges that have equal edge lengths, a first of the four triangular surfaces defines a base of the tetrahedron, a second, third and fourth of the four triangular surfaces meet to define a vertex of the tetrahedron, and truncating of the tetrahedron is a result of performing a first-level cut that removes a portion of the tetrahedron at a plane parallel with one of the edges to yield a first of the two rectangular surfaces, and performing a second-level cut at a plane parallel to the first of the two rectangular surfaces.

16. The metamaterial system of claim 15, wherein each of the elements has a ratio of exposed surface to volume of greater than twelve divided by the edge lengths of the tetrahedron.

17. The metamaterial system of claim 15, wherein the first-level and second-level cuts have respective lengths that are each a percentage of the edge lengths of the tetrahedron.

18. The metamaterial system of claim 17, wherein the percentage of the edge lengths corresponding to the length of the second-level cut is greater than the percentage of the edge lengths corresponding to the length of the first-level cut.

19. The metamaterial system of claim 17, wherein the length of the first-level cut is between 0.1% and 49.9% of the edge lengths of the tetrahedron and the length of the second-level cut is between 0.2% and 49.9% of the edge lengths of the tetrahedron.

20. The metamaterial system of claim 10, wherein the elements are formed of at least two different materials.

* * * * *